United States Patent
Dhar et al.

(10) Patent No.: US 9,396,946 B2
(45) Date of Patent: *Jul. 19, 2016

(54) WET CHEMISTRY PROCESSES FOR FABRICATING A SEMICONDUCTOR DEVICE WITH INCREASED CHANNEL MOBILITY

(75) Inventors: Sarit Dhar, Cary, NC (US); Lin Cheng, Chapel Hill, NC (US); Sei-Hyung Ryu, Cary, NC (US); Anant Agarwal, Chapel Hill, NC (US); John Williams Palmour, Cary, NC (US); Erik Maki, Wake Forest, NC (US); Jason Gurganus, Raleigh, NC (US); Daniel Jenner Lichtenwalner, Raleigh, NC (US)

(73) Assignee: Cree, Inc., Durham, NC (US)

( * ) Notice: Subject to any disclaimer, the term of this patent is extended or adjusted under 35 U.S.C. 154(b) by 414 days.

This patent is subject to a terminal disclaimer.

(21) Appl. No.: 13/229,266

(22) Filed: Sep. 9, 2011

(65) Prior Publication Data

US 2012/0329216 A1 Dec. 27, 2012

Related U.S. Application Data

(60) Provisional application No. 61/501,460, filed on Jun. 27, 2011.

(51) Int. Cl.
*H01L 21/3205* (2006.01)
*H01L 21/04* (2006.01)
(Continued)

(52) U.S. Cl.
CPC ........ *H01L 21/049* (2013.01); *H01L 21/02172* (2013.01); *H01L 21/02282* (2013.01);
(Continued)

(58) Field of Classification Search
CPC ................... H01L 29/66477; H01L 29/66568; H01L 21/02112; H01L 21/02307; H01L 21/02378; H01L 21/02502; H01L 21/049; H01L 21/02288; H01L 21/045; H01L 21/02172; H01L 21/02282; H01L 21/02142; H01L 21/02164; H01L 21/02175; H01L 21/022; H01L 29/513; H01L 29/517; H01L 29/518; H01L 29/7395; H01L 29/78; H01L 29/7802; H01L 29/7813; H01L 29/0619; H01L 29/1608
USPC ............ 438/135, 197, 591; 257/288, E21.19, 257/E21.207, E21.409, E21.41, E21.382
See application file for complete search history.

(56) References Cited

U.S. PATENT DOCUMENTS 4,499,147 A 2/1985 Enomoto et al.
5,918,132 A * 6/1999 Qian et al. ................. 438/299
(Continued)

FOREIGN PATENT DOCUMENTS

JP H11135774 A 5/1999
JP 2000106428 A 4/2000
(Continued)

OTHER PUBLICATIONS

Non-Final Office Action for U.S. Appl. No. 13/229,276, mailed Apr. 1, 2013, 9 pages.

(Continued)

*Primary Examiner* — Khiem D Nguyen
(74) *Attorney, Agent, or Firm* — Anthony J. Josephson

(57) ABSTRACT

Embodiments of a semiconductor device having increased channel mobility and methods of manufacturing thereof are disclosed. In one embodiment, the semiconductor device includes a substrate including a channel region and a gate stack on the substrate over the channel region. The gate stack includes an alkaline earth metal. In one embodiment, the alkaline earth metal is Barium (Ba). In another embodiment, the alkaline earth metal is Strontium (Sr). The alkaline earth metal results in a substantial improvement of the channel mobility of the semiconductor device.

30 Claims, 19 Drawing Sheets

(51) Int. Cl.
| | |
|---|---|
| *H01L 21/02* | (2006.01) |
| *H01L 29/51* | (2006.01) |
| *H01L 29/739* | (2006.01) |
| *H01L 29/78* | (2006.01) |
| *H01L 29/06* | (2006.01) |
| *H01L 29/16* | (2006.01) |

(52) U.S. Cl.
CPC .... *H01L21/02288* (2013.01); *H01L 21/02378* (2013.01); *H01L 21/045* (2013.01); *H01L 29/0619* (2013.01); *H01L 29/513* (2013.01); *H01L 29/517* (2013.01); *H01L 29/518* (2013.01); *H01L 29/7395* (2013.01); *H01L 29/78* (2013.01); *H01L 29/7802* (2013.01); *H01L 29/7813* (2013.01); *H01L 21/022* (2013.01); *H01L 21/02142* (2013.01); *H01L 21/02164* (2013.01); *H01L 21/02175* (2013.01); *H01L 29/1606* (2013.01); *H01L 29/1608* (2013.01)

(56) References Cited

U.S. PATENT DOCUMENTS

| | | | |
|---|---|---|---|
| 6,437,371 | B2 | 8/2002 | Lipkin et al. |
| 6,537,613 | B1 | 3/2003 | Senzaki et al. |
| 7,005,717 | B2 | 2/2006 | Eisenbeiser et al. |
| 7,115,461 | B2 | 10/2006 | Anthony et al. |
| 7,642,609 | B2 * | 1/2010 | Furukawa et al. ............ 257/410 |
| 7,986,016 | B2 | 7/2011 | Kamata et al. |
| 8,207,584 | B2 | 6/2012 | Nabatame et al. |
| 2002/0030181 | A1 | 3/2002 | Stroud |
| 2002/0030191 | A1 | 3/2002 | Das et al. |
| 2002/0072180 | A1 | 6/2002 | Yugami et al. |
| 2002/0089023 | A1 * | 7/2002 | Yu et al. ....................... 257/411 |
| 2002/0146895 | A1 | 10/2002 | Ramdani et al. |
| 2002/0197789 | A1 | 12/2002 | Buchanan et al. |
| 2004/0012043 | A1 | 1/2004 | Gealy et al. |
| 2004/0156164 | A1 * | 8/2004 | Landheer .......... H01L 21/28185 361/311 |
| 2004/0214399 | A1 * | 10/2004 | Ahn .................. H01L 21/28185 438/287 |
| 2005/0104176 | A1 | 5/2005 | Rodney et al. |
| 2005/0112827 | A1 | 5/2005 | Anthony |
| 2005/0151184 | A1 | 7/2005 | Lee et al. |
| 2005/0280105 | A1 | 12/2005 | Andreoni et al. |
| 2006/0166424 | A1 | 7/2006 | Schaeffer, III et al. |
| 2007/0001231 | A1 * | 1/2007 | Currie .......................... 257/368 |
| 2007/0082415 | A1 | 4/2007 | Jeon et al. |
| 2008/0017936 | A1 * | 1/2008 | Buchanan et al. ............ 257/411 |
| 2008/0242077 | A1 | 10/2008 | Clark |
| 2009/0212369 | A1 | 8/2009 | Park et al. |
| 2009/0236595 | A1 | 9/2009 | Atanackovic |
| 2010/0035423 | A1 | 2/2010 | Clark |
| 2010/0072556 | A1 | 3/2010 | Park et al. |
| 2010/0308389 | A1 * | 12/2010 | Bhattacharyya ..... G11C 11/005 257/298 |
| 2011/0215409 | A1 * | 9/2011 | Li et al. ........................ 257/351 |
| 2012/0187420 | A1 | 7/2012 | Li et al. |

FOREIGN PATENT DOCUMENTS

| | | |
|---|---|---|
| JP | 2000150875 A | 5/2000 |
| JP | 2002299338 A | 10/2002 |
| JP | 2004214386 A | 7/2004 |
| JP | 2005135974 A | 5/2005 |
| JP | 2007273531 A | 10/2007 |
| JP | 2009152392 A | 7/2009 |
| JP | 2011029394 A | 2/2011 |
| KR | 1019990014155 A | 2/1999 |
| KR | 1020020006082 A | 1/2002 |

OTHER PUBLICATIONS

International Search Report and Written Opinion for PCT/US2012/044199 mailed Sep. 13, 2012, 13 pages.
Bondoux, C. et al., "MgO insulating films prepared by sol-gel route for SiC substrate," Journal of the European Ceramic Society, vol. 25, No. 12, May 2005, pp. 2795-2798.
Firek, P. et al., "MIS field effect transistor with barium titanate thin film as a gate insulator," Materials Science and Engineering B, vol. 165, No. 1-2, Nov. 2009, pp. 126-128.
Hu, C. et al., "AlGaN/GaN metal-oxide-semiconductor high-electron mobility transistor with liquid-phase-deposited barium-doped $TiO_2$ as a gate dielectric," IEEE Transactions on Electron Devices, vol. 59, No. 1, Jan. 2012, pp. 121-127.
Jiang, J. et al., "On the capacitance of metal/high-k dielectric material stack/silicon structures," Solid-State Electronics, vol. 46, No. 11, Nov. 2002, pp. 1991-1995.
Lu, X. et al., "Metal-ferroelectric-insulator-Si devices using HfTaO buffer layers," Semiconductor Science and Technology, vol. 23, No. 4, Apr. 2008, 5 pages.
Ruzyllo, J. et al., "Studies of high-k dielectrics deposited by liquid source misted chemical deposition in MOS gate structures," IEEE SEMI Advanced Semiconductor Manufacturing Conference, Apr. 2001, pp. 71-75.
Saif, A. et al., "Electrical properties of metal-ferroelectric-insulator-semiconductor structure using $Ba_xSt_{1-x}TiO_3$ for ferroelectric-gate field effect transistor," Solid-State Electronics, vol. 62, No. 1, Mar. 2011, pp. 25-30.
Sochacki, M. et al., "Electronic properties of $BaTiO_3$/4H-SiC interface," Materials Science and Engineering B, vol. 176, No. 4, Aug. 2011, pp. 301-304.
Vitanov, P. et al., "Thin metal oxides films for application in nanoscale devices," 27th International Spring Seminar on Electronics Technology, May 2004, pp. 252-256.
Blodgett, K. et al., "Built-Up Films of Barium Stearate and Their Optical Properties," Physical Review, vol. 51, Jun. 1, 1937, pp. 964-982.
Ihlefeld, J. et al., "Copper Compatible Barium Titanate Thin Films for Embedded Passives," Journal of Electroceramics, vol. 14, No. 2, Mar. 2005, pp. 95-102.
International Preliminary Report on Patentability for International Patent Application No. PCT/US2012/044199, mailed Jan. 16, 2014, 8 pages.
Final Office Action for U.S. Appl. No. 13/229,276, mailed Dec. 18, 2013, 11 pages.
Notice of Allowance for U.S. Appl. No. 13/229,276, mailed Sep. 2, 2014, 11 pages.
Non-Final Office Action for U.S. Appl. No. 13/229,276, mailed Nov. 7, 2014, 9 pages.
Notice of Reason for Rejection for Japanese Patent Application No. 2014-518913, mailed Jan. 30, 2015, 13 pages.
Final Office Action for U.S. Appl. No. 13/229,276, mailed Mar. 27, 2015, 10 pages.
Schwartz, Robert, W. et al, "Chemical solution deposition of electronic oxide films," Connotes Rendus Chimie, vol. 7, Issue 5, May 2004, Elsevier SAS, pp. 433-461.
Non-Final Notice of Preliminary Rejection for Korean Patent Application No. 10-2014-7002125, mailed Aug. 3, 2015, 13 pages.
Non-Final Notice of Preliminary Rejection for Korean Patent Application No. 10-2014-7015854, mailed Aug. 11, 2015, 21 pages.
Notice of Allowance for U.S. Appl. No. 13/229,276, mailed Jul. 9, 2015, 10 pages.
Notice of Allowance for Korean Patent Application No. 10-2014-7002125, mailed Dec. 7, 2016, 5 pages.
Corrected Notice of Allowance and Applicant-Initiated Interview Summary for U.S. Appl. No. 13/229,276, mailed Feb. 24, 2016, 9 pages.

(56) References Cited

OTHER PUBLICATIONS

Corrected Notice of Allowance for U.S Appl. No. 13/229,276, mailed Dec. 3, 2015, 6 pages.
Corrected Notice of Allowance for U.S Appl. No. 13/229,276, mailed Jan. 14, 2016, 14 pages. Office Action and Search Report for Taiwan Patent Application No. 101123054, issued May 12, 2014, 15 pages (with English translation).
Notice of Reasons for Rejection for Japanese Patent Application No. 2014-518913, mailed Apr. 4, 2016, 5 pages.

* cited by examiner

WET CHEMISTRY PROCESSES FOR FABRICATING A SEMICONDUCTOR DEVICE WITH INCREASED CHANNEL MOBILITY

RELATED APPLICATIONS

This application claims the benefit of U.S. Provisional Patent Application No. 61/501,460, filed Jun. 27, 2011, the disclosure of which is incorporated herein by reference in its entirety.

This application is related to U.S. patent application Ser. No. 13/229,276, entitled SEMICONDUCTOR DEVICE WITH INCREASED CHANNEL MOBILITY AND DRY CHEMISTRY PROCESSES FOR FABRICATION THEREOF, which was filed Sep. 9, 2011, which is commonly owned and assigned and is hereby incorporated herein by reference in its entirety.

GOVERNMENT SUPPORT

This invention was made with government funds under contract number W911 NF-10-2-0038 awarded by the U.S. Army. The U.S. Government may have rights in this invention.

FIELD OF THE DISCLOSURE

The present disclosure relates to semiconductor devices, and more particularly relates to semiconductor devices having increased channel mobility.

BACKGROUND

Standard Silicon Carbide (SiC) Metal-Oxide-Semiconductor Field Effect Transistors (MOSFETs) suffer from low channel mobility, or high channel resistance, that results in heavy conduction losses. The low channel mobility is due in large part to the gate oxidation process, whereby a defected interface between the gate oxide and the underlying SiC is formed. Defects which occur at the gate oxide/SiC interface trap charge and scatter carriers which result in a reduced channel mobility. As such, there is a need for a gate oxidation process that improves the channel mobility, or channel resistance, of SiC MOSFETs and similar semiconductor devices.

SUMMARY

Embodiments of a semiconductor device having increased channel mobility and methods of manufacturing thereof are disclosed. In one embodiment, the semiconductor device includes a substrate including a channel region and a gate stack on the substrate over the channel region, where the gate stack includes an alkaline earth metal. The alkaline earth metal may be, for example, Barium (Ba) or Strontium (Sr). The alkaline earth metal results in a substantial improvement of the channel mobility of the semiconductor device. In one embodiment, the substrate is a Silicon Carbide (SiC) substrate and the channel mobility of the semiconductor device is at least two and a half times greater than that of the same semiconductor device without the alkaline earth metal. In another embodiment, the substrate is a SiC substrate and the channel mobility of the semiconductor device is at least 50 $cm^2V^{-1}s^{-1}$ for control voltages greater than 3 Volts. In yet another embodiment, the substrate is a SiC substrate and the channel mobility of the semiconductor device is at least 50 $cm^2V^{-1}s^{-1}$ for control voltages in a range of and including 3 Volts to 15 Volts.

In one embodiment, the gate stack includes an interlayer containing an alkaline earth metal on the substrate over the channel region and one or more additional gate stack layers on a surface of the interlayer opposite the substrate. Further, in one embodiment, the one or more additional gate stack layers include a gate oxide layer on the surface of the interlayer opposite the substrate and a gate contact on a surface of the gate oxide opposite the interlayer. In another embodiment, the gate stack includes a gate oxide layer containing an alkaline earth metal. In yet another embodiment, the gate stack includes an alkaline earth metal-oxide-alkaline earth metal structure that includes a first alkaline earth metal rich layer, an oxide layer on a surface of the first alkaline earth metal rich layer, and a second alkaline earth metal rich layer on a surface of the oxide layer opposite the first alkaline earth metal rich layer.

A Metal-Oxide-Semiconductor (MOS) device having increased channel mobility is also disclosed. In one embodiment, the MOS device is a lateral MOS Field Effect Transistor (MOSFET) including a substrate, a source region formed in the substrate, a drain region formed in the substrate, and a gate stack formed on the substrate between the source and drain regions. The gate stack includes an alkaline earth metal. The alkaline earth metal may be, for example, Ba or Sr. The alkaline earth metal results in a substantial improvement of the channel mobility of the MOSFET. In one embodiment, the substrate is a SiC substrate and the channel mobility of the MOSFET is at least two and a half times greater than that of the same MOSFET without the alkaline earth metal. In another embodiment, the substrate is a SiC substrate and the channel mobility of the MOSFET is at least 50 $cm^2V^{-1}s^{-1}$ for control voltages greater than 3 Volts. In yet another embodiment, the substrate is a SiC substrate and the channel mobility of the MOSFET is at least 50 $cm^2V^{-1}s^{-1}$ for control voltages in a range of and including 3 Volts to 15 Volts.

In one embodiment, the gate stack of the lateral MOSFET includes an interlayer containing an alkaline earth metal on the substrate between the source and drain regions and one or more additional gate stack layers on a surface of the interlayer opposite the substrate. Further, in one embodiment, the one or more additional gate stack layers include a gate oxide layer on the surface of the interlayer opposite the substrate and a gate contact on a surface of the gate oxide opposite the interlayer. In another embodiment, the gate stack of the lateral MOSFET includes a gate oxide layer containing an alkaline earth metal. In yet another embodiment, the gate stack of the lateral MOSFET includes an alkaline earth metal-oxide-alkaline earth metal structure that includes a first alkaline earth metal rich layer, an oxide layer on a surface of the first alkaline earth metal rich layer, and a second alkaline earth metal rich layer on a surface of the oxide layer opposite the first alkaline earth metal rich layer.

In another embodiment, the MOS device is a vertical MOSFET including a substrate, a source region formed in the substrate, a gate stack formed on the substrate over a channel region, and a drain on a surface of the substrate opposite the gate stack. The gate stack includes an alkaline earth metal. The alkaline earth metal may be, for example, Ba or Sr. The alkaline earth metal results in a substantial improvement of the channel mobility of the MOSFET. In one embodiment, the substrate is a SiC substrate and the channel mobility of the MOSFET is at least two and a half times greater than that of the same MOSFET without the alkaline earth metal. In another embodiment, the substrate is a SiC substrate and the channel mobility of the MOSFET is at least 50 $cm^2V^{-1}s^{-1}$ for control voltages greater than 3 Volts. In yet another embodiment, the substrate is a SiC substrate and the channel mobility of the MOSFET is at least 50 $cm^2V^{-1}s^{-1}$ for control voltages in a range of and including 3 Volts to 15 Volts.

In one embodiment, the gate stack of the vertical MOSFET includes an interlayer containing an alkaline earth metal on the substrate and one or more additional gate stack layers on a surface of the interlayer opposite the substrate. Further, in one embodiment, the one or more additional gate stack layers include a gate oxide layer on the surface of the interlayer opposite the substrate and a gate contact on a surface of the gate oxide opposite the interlayer. In another embodiment, the gate stack of the vertical MOSFET includes a gate oxide layer containing an alkaline earth metal. In yet another embodiment, the gate stack of the vertical MOSFET includes an alkaline earth metal-oxide-alkaline earth metal structure that includes a first alkaline earth metal rich layer, an oxide layer on a surface of the first alkaline earth metal rich layer, and a second alkaline earth metal rich layer on a surface of the oxide layer opposite the first alkaline earth metal rich layer.

An Insulated Gate Bipolar Transistor (IGBT) having increased channel mobility is also disclosed. The IGBT includes a substrate, an emitter region formed in the substrate, a gate stack formed on the substrate over a channel region, and a collector on a surface of the substrate opposite the gate stack. The gate stack includes an alkaline earth metal. The alkaline earth metal may be, for example, Ba or Sr. The alkaline earth metal results in a substantial improvement of the channel mobility of the IGBT. In one embodiment, the substrate is a SiC substrate and the channel mobility of the IGBT is at least two and a half times greater than that of the same IGBT without the alkaline earth metal. In another embodiment, the substrate is a SiC substrate and the channel mobility of the IGBT is at least 50 $cm^2V^{-1}s^{-1}$ for control voltages greater than 3 Volts. In yet another embodiment, the substrate is a SiC substrate and the channel mobility of the IGBT is at least 50 $cm^2V^{-1}s^{-1}$ for control voltages in a range of and including 3 Volts to 15 Volts.

In one embodiment, the gate stack of the IGBT includes an interlayer containing an alkaline earth metal on the substrate and one or more additional gate stack layers on a surface of the interlayer opposite the substrate. Further, in one embodiment, the one or more additional gate stack layers include a gate oxide layer on the surface of the interlayer opposite the substrate and a gate contact on a surface of the gate oxide opposite the interlayer. In another embodiment, the gate stack of the IGBT includes a gate oxide layer containing an alkaline earth metal. In yet another embodiment, the gate stack of the IGBT includes an alkaline earth metal-oxide-alkaline earth metal structure that includes a first alkaline earth metal rich layer, an oxide layer on a surface of the first alkaline earth metal rich layer, and a second alkaline earth metal rich layer on a surface of the oxide layer opposite the first alkaline earth metal rich layer.

A trench, or U-shaped, Field Effect Transistor (FET) having increased channel mobility is also disclosed. The trench FET includes a first semiconductor layer of a first conductivity type, a drift region of the first conductivity type on a first surface of the first semiconductor layer, a well of a second conductivity type on a surface of the drift region opposite the first semiconductor layer, a source region of the first conductivity type on or in the well opposite the drift region, a trench that extends from a surface of the source region through the well to the surface of the drift region opposite the first semiconductor layer, and a gate stack in the trench. The gate stack includes an alkaline earth metal. The alkaline earth metal may be, for example, Ba or Sr. The alkaline earth metal results in a substantial improvement of the channel mobility of the trench FET. In one embodiment, the substrate is a SiC substrate and the channel mobility of the trench FET is at least two and a half times greater than that of the same trench FET without the alkaline earth metal. In another embodiment, the substrate is a SiC substrate and the channel mobility of the trench FET is at least 50 $cm^2V^{-1}s^{-1}$ for control voltages greater than 3 Volts. In yet another embodiment, the substrate is a SiC substrate and the channel mobility of the trench FET is at least 50 $cm^2V^{-1}s^{-1}$ for control voltages in a range of and including 3 Volts to 15 Volts.

In one embodiment, the gate stack of the trench FET includes an interlayer containing an alkaline earth metal on the surface of the drift region opposite the first semiconductor layer and one or more additional gate stack layers on a surface of the interlayer opposite the drift region. Further, in one embodiment, the one or more additional gate stack layers include a gate oxide layer on the surface of the interlayer opposite the drift region and a gate contact on a surface of the gate oxide opposite the interlayer. In another embodiment, the gate stack of the trench FET includes a gate oxide layer containing an alkaline earth metal. In yet another embodiment, the gate stack of the trench FET includes an alkaline earth metal-oxide-alkaline earth metal structure that includes a first alkaline earth metal rich layer, an oxide layer on a surface of the first alkaline earth metal rich layer, and a second alkaline earth metal rich layer on a surface of the oxide layer opposite the first alkaline earth metal rich layer.

A semiconductor device having a passivation structure that includes an alkaline earth metal is also disclosed. In one embodiment, the passivation structure includes an interlayer containing an alkaline earth metal on a surface of a substrate and a dielectric layer on a surface of the interlayer opposite the substrate. In another embodiment, the passivation structure includes a dielectric layer containing an alkaline earth metal, where the dielectric layer is on a surface of the substrate. In yet another embodiment, the passivation structure includes an alkaline earth metal-oxide-alkaline earth metal structure including a first alkaline earth metal rich layer on a surface of the substrate, an oxide layer on a surface of the first alkaline earth metal rich layer opposite the substrate, and a second alkaline earth metal rich layer on a surface of the oxide layer opposite the first alkaline earth metal rich layer.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 illustrates a lateral Metal-Oxide-Semiconductor Field Effect Transistor (MOSFET) having a gate stack that includes an interlayer containing an alkaline earth metal according to one embodiment of the present disclosure;

FIGS. 2A through 2E graphically illustrate an exemplary process for fabricating the MOSFET of FIG. 1 according to one embodiment of the present disclosure;

FIG. 3 graphically illustrates the improvement of the channel mobility of the MOSFET of FIG. 1 as compared to that of a conventional MOSFET device;

FIG. 4 graphically illustrates elemental depth profiles for one exemplary embodiment of the MOSFET of FIG. 1;

DETAILED DESCRIPTION

Figure 1:
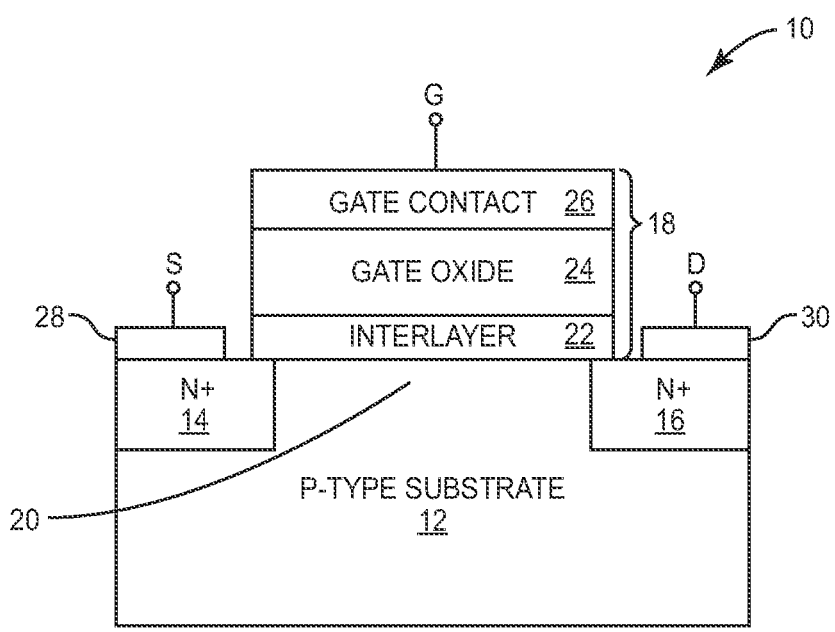

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates a Silicon Carbide (SiC) lateral Metal-Oxide-Semiconductor Field Effect Transistor (MOSFET) 10 (hereinafter "MOSFET 10") according to one embodiment of the present disclosure. As illustrated, the MOSFET 10 includes a p-type SiC substrate 12, a first n+ well 14 forming a source region of the MOSFET 10, a second n+ well 16 forming a drain region of the MOSFET 10, and a gate stack 18 arranged as shown. The p-type SiC substrate 12 may be of the 4H, 6H, 3C, or 15R polytype. Note that, as used herein, a "substrate" may be a bulk substrate, a series of epitaxial layers (i.e., epilayers), or a combination thereof (i.e., a series of one or more epilayers grown on a bulk substrate). The gate stack 18 is formed on the surface of the substrate 12 between the source and drain regions such that the gate stack 18 is deposited over a channel region 20 of the MOSFET 10. The gate stack 18 includes an interlayer 22 on the surface of the substrate 12 over the channel region 20. Additionally, the gate stack 18 may include a gate oxide 24 on the surface of the interlayer 22 opposite the substrate 12, and a gate contact 26 on the surface of the gate oxide 24 opposite the interlayer 22.

The interlayer 22 contains an alkaline earth metal. The alkaline earth metal is preferably Barium (Ba) or Strontium (Sr). However, other alkaline earth metals may be used. The interlayer 22 may be, for example:
- a layer of alkaline earth metal (e.g., a layer of Ba or a layer of Sr),
- multiple layers of the same or different alkaline earth metals (e.g., multiple layers of Ba or a layer of Ba followed by a layer of Sr),
- one or more layers of the same or different alkaline earth metals and one or more layers of the same or different oxides on or directly on the one or more layers of alkaline earth metal,
- one or more oxide layers containing an alkaline earth metal (e.g., Barium Oxide (BaO) or $Ba_XSi_YO_Z$),
- an alkaline earth metal-oxide-alkaline earth metal structure containing one or more first layers of alkaline earth metal, one or more layers of oxide on or directly on the one or more first layers of alkaline earth metal, and one or more second layers of alkaline earth metal on or directly on the one or more layers of oxide opposite the one or more first layers of alkaline earth metal, or
- one or more oxynitride layers containing an alkaline earth metal (e.g., $BaO_XN_Y$).

In one exemplary embodiment, the interlayer 22 is $Ba_XSi_YO_Z$. In one embodiment, the interlayer 22 has a thickness in the range of and including 2 Angstroms to 15 Angstroms.

As a result of the gate stack 18 including an alkaline earth metal, e.g., the interlayer 22 containing the alkaline earth metal, a channel mobility of the MOSFET 10 is substantially greater than that of a conventional SiC MOSFET (e.g., the same SiC MOSFET but without the interlayer 22) without significantly lowering a threshold voltage of the MOSFET 10. In one embodiment, the channel mobility of the MOSFET 10 is at least two and a half times greater than that of the same MOSFET without the interlayer 22 containing the alkaline earth metal. In another embodiment, the channel mobility of the MOSFET 10 is at least 50 $cm^2V^{-1}s^{-1}$ for control voltages greater than 3 Volts. In another embodiment, the channel mobility of the MOSFET 10 is at least 40 $cm^2V^{-1}s^{-1}$ for control voltages greater than 2.5 Volts. In another embodiment, the channel mobility of the MOSFET 10 is at least 60 $cm^2V^{-1}s^{-1}$ for control voltages greater than 4 Volts. In another embodiment, the channel mobility of the MOSFET 10 is in a range of and including 40-75 $cm^2V^{-1}s^{-1}$ for control voltages greater than 2.5 Volts. In another embodiment, the channel mobility of the MOSFET 10 is in a range of and including 50-75 $cm^2V^{-1}s^{-1}$ for control voltages greater than 3 Volts. In yet another embodiment, the channel mobility of the MOSFET 10 is at least 50 $cm^2V^{-1}S^{-1}$ for control voltages in a range of and including 3 Volts to 15 Volts. Likewise, in other embodiments, the channel mobility of the MOSFET 10 is at least 40 $cm^2V^{-1}s^{-1}$ for control voltages in a range of and including 2.5 Volts to 15 Volts, at least 60 $cm^2V^{-1}s^{-1}$ for control voltages in a range of and including 4 Volts to 15 Volts, in a range of and including 40-75 $cm^2V^{-1}s^{-1}$ for control voltages in a range of and including 2.5 Volts to 15 Volts, and in a range of and including 50-75 $cm^2V^{-1}s^{-1}$ for control voltages in a range of and including 3 Volts to 15 Volts.

The gate oxide 24 is preferably Silicon Dioxide ($SiO_2$), but is not limited thereto. For example, the gate oxide 24 may alternatively be formed of Aluminum Oxide ($Al_2O_3$), Hafnium Oxide ($HfO_2$), or similar dielectric material. A thickness of the gate oxide 24 may vary depending on the particular implementation. As one example, the thickness of the gate oxide 24 is in the range of and including 300 Angstroms to 1000 Angstroms. The gate contact 26 is preferably polysilicon, but is not limited thereto. The gate contact 26 may alternatively be formed of a metal such as, for example, Aluminum (Al), Platinum (Pt), Molybdenum (Mo), or the like.

Lastly, the MOSFET 10 includes a metal source contact 28 formed over the first n+ well 14 to provide a source contact for the MOSFET 10. Likewise, a metal drain contact 30 is formed over the second n+ well 16 to provide a drain contact for the MOSFET 10. The metal source and drain contacts 28 and 30 may be formed of, for example, Nickel (Ni), Nickel Silicide (NiSi), Tantalum Disilicide ($TaSi_2$), or the like. In operation, when a positive gate voltage is applied to the gate contact 26, an n-type inversion channel is created between the n+ wells 14 and 16 forming the source and drain regions of the MOSFET 10. When the gate voltage is greater than a turn-on, or threshold, voltage of the MOSFET 10, current flows from the source region to the drain region of the MOSFET 10.

Figure 2A:
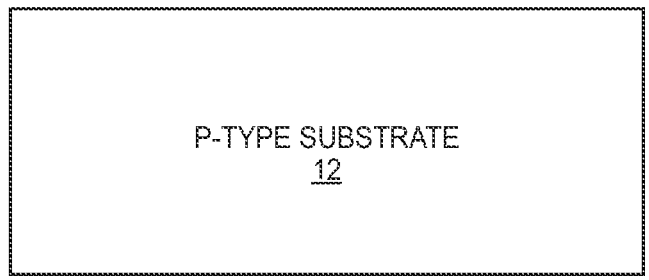
Figure 2B:
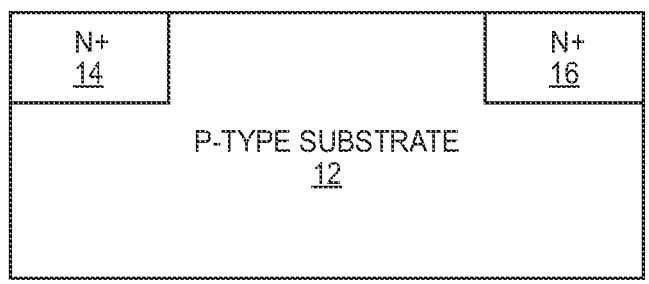

FIGS. 2A through 2E graphically illustrate an exemplary process for fabricating the MOSFET 10 of FIG. 1 according to one embodiment of the present disclosure. As illustrated in FIG. 2A, the process begins with the p-type SiC substrate 12. Again, as used herein, a "substrate" may be a bulk substrate, a series of epitaxial layers, or a combination thereof (i.e., one or more epitaxial layers formed on a bulk substrate). Then, as illustrated in FIG. 2B, the n+ wells 14 and 16 are formed in the substrate 12. The n+ wells 14 and 16 may be formed using a conventional technique such as ion implantation.

Figure 2C:
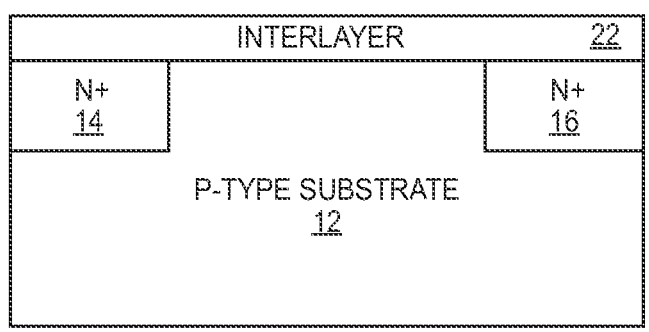

Next, the interlayer 22 is formed on, and in this particular embodiment directly on, the surface of the substrate 12, as illustrated in FIG. 2C. In one particular embodiment, a Ba or BaO layer is deposited on, and preferably directly on, the substrate 12 as the interlayer 22. Note again, however, that the interlayer 22 may contain other alkaline earth metals such as, for example, Sr. The Ba or BaO may be deposited using any suitable technique such as, for example, Molecular Beam Epitaxy (MBE), thermal evaporation, e-beam evaporation, sputtering, Chemical Vapor Deposition (CVD), atomic layer deposition, spin coating, dip coating, ink-jet printing, or the like. The thickness of the interlayer 22 is preferably in the range of and including 2 Angstroms to 15 Angstroms. Even more preferably, the thickness of the interlayer 22 is in the range of and including 2 Angstroms to 10 Angstroms.

More specifically, the interlayer 22 may be formed via dry or wet chemistry. With regards to dry chemistry, the interlayer 22 may be formed using, for example, one of the following dry chemistry processes:
- depositing the interlayer 22 via molecular beam deposition or other vacuum evaporation or deposition processes,
- depositing an alkaline earth metal and then oxidizing the deposited alkaline earth metal (without thermal annealing),
- depositing an alkaline earth metal, oxidizing the deposited alkaline earth metal, and then thermally annealing,
- depositing an oxide containing an alkaline earth metal with no thermal annealing,
- depositing an oxide containing an alkaline earth metal and then thermally annealing the deposited oxide,
- depositing an alkaline earth metal, oxidizing the deposited alkaline earth metal (without thermal annealing), and then capping oxidized alkaline earth metal with silicon oxide ($SiO_X$) in situ, where the $SiO_X$ is either the gate oxide 24 or part of the interlayer 22,
- depositing an alkaline earth metal, oxidizing the deposited alkaline earth metal, thermally annealing, and then capping the oxidized alkaline earth metal with $SiO_X$ in situ, where the $SiO_X$ is either the gate oxide 24 or part of the interlayer 22, depositing an oxide containing an alkaline earth metal with no thermal annealing and then capping the oxide with $SiO_X$ in situ, where the $SiO_X$ is either the gate oxide 24 or part of the interlayer 22, depositing an oxide containing an alkaline earth metal, thermally annealing the deposited oxide, and then capping the oxide with $SiO_X$ in situ, where the $SiO_X$ is either the gate oxide 24 or part of the interlayer 22, implanting an alkaline earth metal into the surface of the substrate 12 using a plasma process such as, for example, plasma-immersion ion implantation (i.e., a plasma process with a voltage bias that results in ions being implanted into the surface of the substrate 12) and then oxidizing, diffusing an alkaline earth metal into a surface of the substrate 12 via solid state diffusion, depositing the interlayer 22 via atomic layer deposition, depositing an alkaline earth metal or oxide containing an alkaline earth metal via Plasma Enhanced Chemical Vapor Deposition (PECVD), depositing an alkaline earth metal or oxide containing an alkaline earth metal via Metallo-Organic Chemical Vapor Deposition (MOCVD), or printing an alkaline earth metal or oxide containing an alkaline earth metal onto the surface of the substrate 12.

With regards to wet chemistry, the interlayer 22 may be formed using, for example, one of the following wet chemistry processes:

dipping the substrate 12 into a fluid containing an alkaline earth metal and spinning dry (no oxidation), dipping the substrate 12 into a fluid containing an alkaline earth metal, spin drying the substrate 12, and then oxidizing the resulting alkaline earth metal left behind on the surface of the substrate 12 after spin drying, spinning a fluid containing an alkaline earth metal onto the surface of the substrate 12 and drying the surface of the substrate 12 (no oxidation), spinning a fluid containing an alkaline earth metal onto the surface of the substrate 12, drying the surface of the substrate 12, and then oxidizing the resulting alkaline earth metal left behind on the surface of the substrate 12 after drying, immersing the substrate 12 into a fluid containing an alkaline earth metal and then draining in an oxygen rich environment, bubbling a fluid containing an alkaline earth metal through an oxide (e.g., $SiO_2$) on a surface of the substrate 12 and then oxidizing in a furnace, vapor phase deposition of a fluid containing an alkaline earth metal onto the surface of the substrate 12 in a temperature controlled environment, spraying a fluid containing an alkaline earth metal onto the surface of the substrate 12, or ink-jet printing of the fluid onto the appropriate (i.e., gate) regions of the substrate.

The fluid containing an alkaline earth metal may be, for example, barium acetate, barium nitrate, or other soluble barium (or alkaline earth) compound, in a liquid solution such as aqueous or alcohol-based solutions, or the like. Additionally, the solution could contain the alkaline earth element, and other dielectrics; such as a spin-on-glass solution (commercially available solution for aqueous $SiO_2$ processing) mixed with said alkaline earth solutions or soluble alkaline earth compounds. The solution effectiveness can be controlled by the surface tension of the solutions with respect to the SiC sample, by the pH, or by electrochemical potentials applied between solution and sample.

Figure 2D:
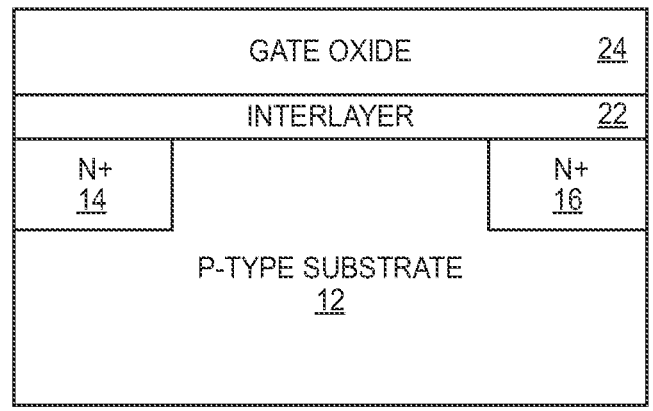

As illustrated in FIG. 2D, the gate oxide 24 is then formed on, and in this embodiment directly on, the surface of the interlayer 22 opposite the substrate 12. In this embodiment, the gate oxide 24 is $SiO_2$ having a thickness of approximately 500 Angstroms. However, again, other dielectric materials may be used. The gate oxide 24 may be formed using any suitable technique such as, for example, PECVD, sputter deposition, or electron beam deposition. Next, the interlayer 22 and the gate oxide 24 are densified by annealing in oxygen. In one exemplary embodiment, annealing is performed at a temperature of 950 degrees Celsius for 1.5 hours. However, the temperature, time, and ambient used for the annealing process may be varied to optimize device characteristics and to improve reliability as desired for a particular implementation. Notably, the annealing may result in chemical bonding of elements present in the interlayer 22 and the gate oxide 24. For example, in one particular embodiment, the interlayer 22 is initially formed by depositing a Ba or BaO layer, and the gate oxide 24 is $SiO_2$ such that, after annealing, the interlayer 22 is formed of, or at least includes, $Ba_xSi_yO_y$.

Figure 2E:
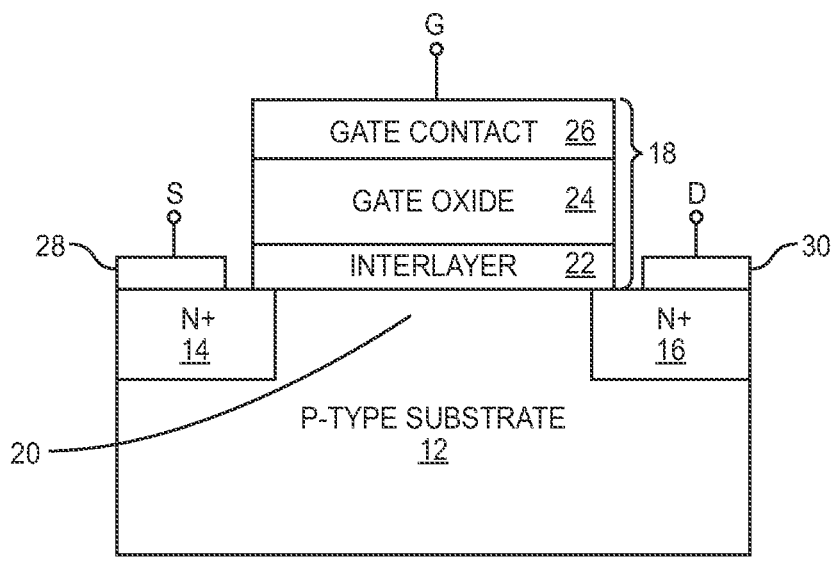

Lastly, as illustrated in FIG. 2E, the gate contact 26 and the metal source and drain contacts 28 and 30 are formed. As an example, the gate contact 26 may be formed of Molybdenum (Mo) and have a thickness of 35 nanometers. However, other gate materials and thicknesses may be used. The metal source and drain contacts 28 and 30 are ohmic contacts formed using known ohmic contact formation techniques. More specifically, as an example, a gate contact material is formed on, and in this embodiment directly on, the surface of the gate oxide 24 opposite the interlayer 22. The gate material, the gate oxide 24, and the interlayer 22 are then etched to form the gate stack 18 between the n+ wells 14 and 16. The source and drain contacts 28 and 30 are then formed on the n+ wells 14 and 16, respectively.

Figure 3:
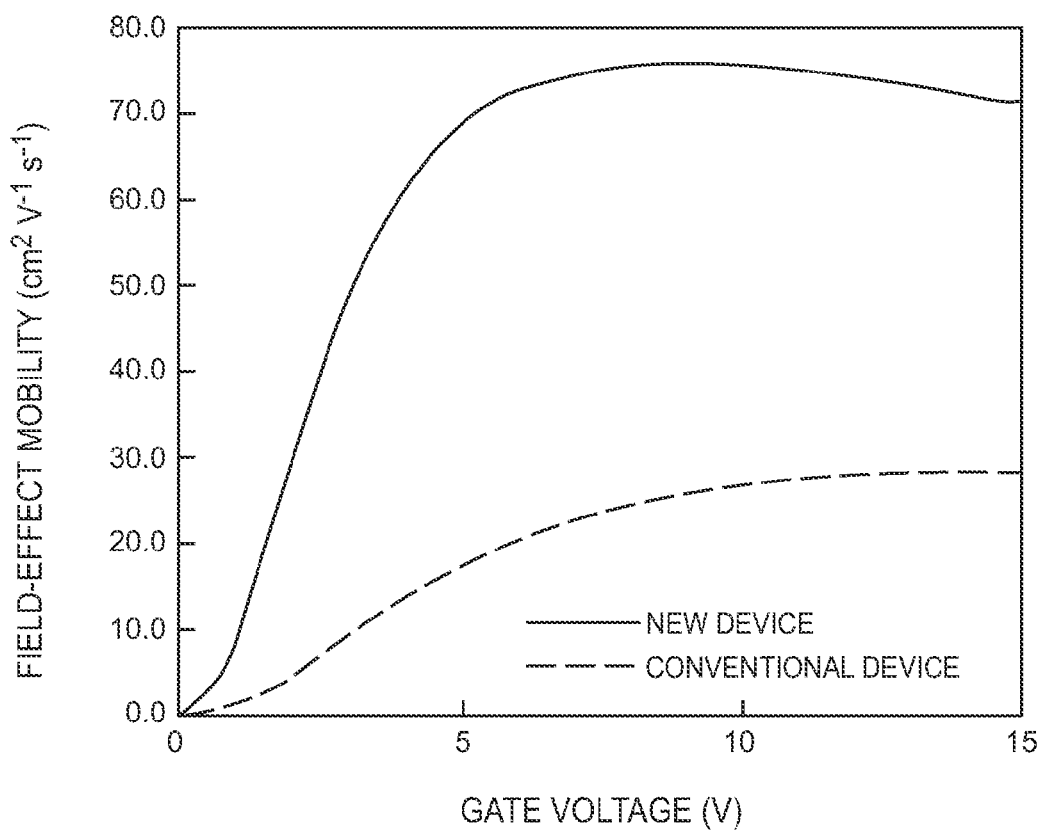

FIG. 3 graphically illustrates the channel mobility of an exemplary embodiment of the MOSFET 10 as compared to that of a conventional SiC MOSFET. As illustrated, the channel mobility of the MOSFET 10 is at least approximately two and a half times that of the conventional SiC MOSFET. Further, the channel mobility of the MOSFET 10 is at least 50 $cm^2V^{-1}s^{-1}$ for control voltages greater than 3 Volts. The channel mobility of the MOSFET 10 is also at least 40 $cm^2V^{-1}s^{-1}$ for control voltages greater than 2.5 Volts, at least 60 $cm^2V^{-1}s^{-1}$ for control voltages greater than 4 Volts, in a range of and including 40-75 $cm^2V^{-1}s^{-1}$ for control voltages greater than 2.5 Volts, and in a range of and including 50-75 $cm^2V^{-1}s^{-1}$ for control voltages greater than 3 Volts. Still further, the channel mobility of the MOSFET 10 is at least 50 $cm^2V^{-1}s^{-1}$ for control voltages in a range of and including 3 Volts to 15 Volts. Likewise, the channel mobility of the MOSFET 10 is also at least 40 $cm^2V^{-1}s^{-1}$ for control voltages in a range of and including 2.5 Volts to 15 Volts, at least 60 $cm^2V^{-1}s^{-1}$ for control voltages in a range of and including 4 Volts to 15 Volts, in a range of and including 40-75 $cm^2V^{-1}s^{-1}$ for control voltages in a range of and including 2.5 Volts to 15 Volts, and in a range of and including 50-75 $cm^2V^{-1}s^{-1}$ for control voltages in a range of and including 3 Volts to 15 Volts.

Figure 4:
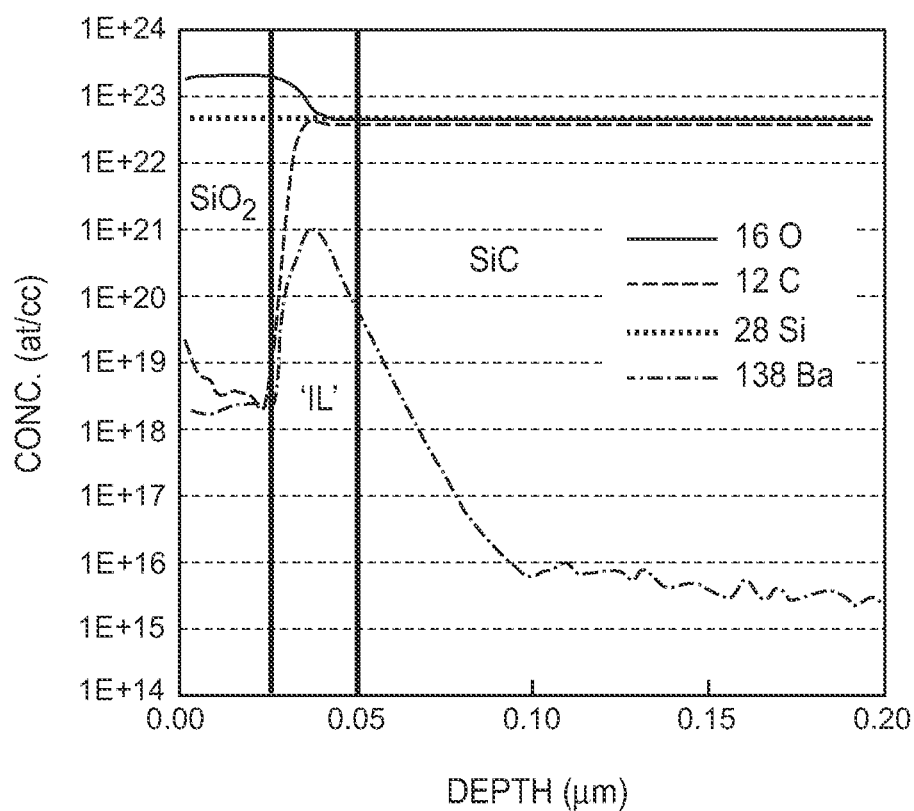

FIG. 4 graphically illustrates elemental depth profiles for one exemplary embodiment of the MOSFET 10 of FIG. 1. The elemental depth profiles are more specifically Secondary Ion Mass Spectrometry (SIMS) profiles of various elements in one exemplary embodiment of the gate stack 18 of the MOSFET 10. In this embodiment, the interlayer 22 contains Ba and is approximately 6 Angstroms thick, and the gate oxide 24 is $SiO_2$ and is approximately 500 Angstroms thick. The vertical lines roughly show the interface between the substrate 12 and the interlayer 22 and the interface between the interlayer 22 and the gate oxide 24.

While the discussion thus far has focused on the MOSFET 10, which is a lateral MOSFET, the present disclosure is not limited thereto. The concepts disclosed herein are equally applicable to other types of MOS devices (e.g., vertical MOSFETs, power MOSFETs such as, for example, Double-implanted MOSFETs (DMOSFETs) and U-Shape or trench MOSFETs (UMOSFETs), or the like) and other types of similar devices such as, for example, Insulated Gate Bipolar Transistors (IGBTs).

Figure 5:
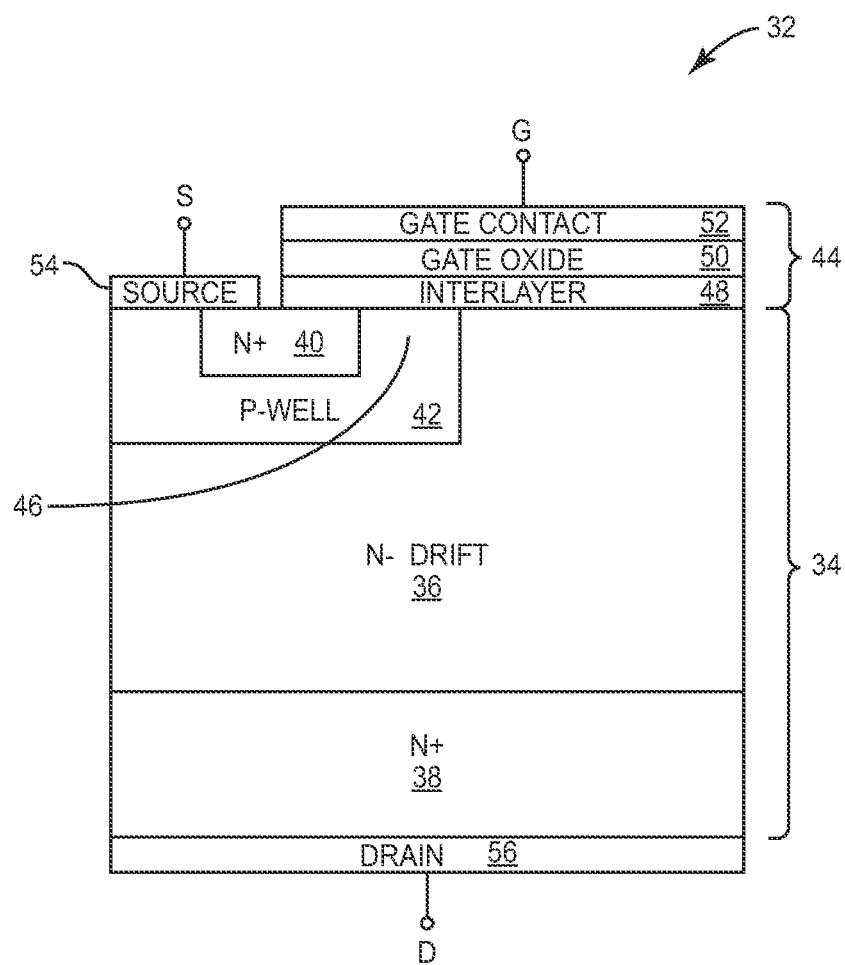
FIG. 5 illustrates a Double-implanted MOSFET (DMOSFET) having a gate stack that includes an interlayer containing an alkaline earth metal according to one embodiment of the present disclosure.

FIG. 5 illustrates a SiC DMOSFET 32 (hereinafter "DMOSFET 32") according to one embodiment of the present disclosure. Note that the DMOSFET 32 is an exemplary vertical MOSFET. As illustrated, the DMOSFET 32 includes a SiC substrate 34, which is preferably 4H-SiC. In this embodiment, the SiC substrate 34 includes a lightly doped n-type drift layer 36 and a heavily doped n-type layer 38. The n-type layer 38 forms a drain region of the DMOSFET 32. The DMOSFET 32 also includes an n+ source region 40 formed in a p-type well 42, and a gate stack 44 arranged as shown. The gate stack 44 is formed over a channel region 46 of the DMOSFET 32 as shown. The gate stack 44 is the same as the gate stack 18 of FIG. 1. Specifically, the gate stack 44 includes an interlayer 48 on or directly on the surface of the substrate 34 over the channel region 46, a gate oxide 50 on or directly on the surface of the interlayer 48 opposite the substrate 34, and a gate contact 52 on or directly on the surface of the gate oxide 50 opposite the interlayer 48.

The interlayer 48 contains an alkaline earth metal. The alkaline earth metal is preferably Ba or Sr. However, other alkaline earth metals may be used. The interlayer 48 may be, for example:
- a layer of alkaline earth metal (e.g., a layer of Ba or Sr),
- multiple layers of the same or different alkaline earth metals (e.g., multiple layers of Ba or a layer of Ba followed by a layer of Sr),
- one or more layers of the same or different alkaline earth metals and one or more layers of the same or different oxides on or directly on the one or more layers of alkaline earth metal,
- one or more oxide layers containing an alkaline earth metal (e.g., BaO or $Ba_XSi_YO_Z$),
- an alkaline earth metal-oxide-alkaline earth metal structure containing one or more first layers of alkaline earth metal, one or more layers of oxide on or directly on the one or more first layers of alkaline earth metal, and one or more second layers of alkaline earth metal on or directly on the one or more layers of oxide opposite the one or more first layers of alkaline earth metal, or
- one or more oxynitride layers containing an alkaline earth metal (e.g., $BaO_XN_Y$).

In one exemplary embodiment, the interlayer 48 is $Ba_XSi_YO_Y$. In one embodiment, the interlayer 48 has a thickness in the range of and including 2 Angstroms to 15 Angstroms. Notably, the interlayer 48 may be formed using, for example, any of the dry or wet chemistry processes described above with respect to the interlayer 22.

As a result of the gate stack 44 including an alkaline earth metal, e.g., the interlayer 48 containing the alkaline earth metal, a channel mobility of the DMOSFET 32 is substantially greater than that of a conventional SiC DMOSFET (e.g., the same SiC DMOSFET but without the interlayer 48) without significantly lowering a threshold voltage of the DMOSFET 32. In one embodiment, the channel mobility of the DMOSFET 32 is at least two and a half times greater than that of the same DMOSFET without the interlayer 48 containing the alkaline earth metal. In another embodiment, the channel mobility of the DMOSFET 32 is at least 50 $cm^2V^{-1}s^{-1}$ for control voltages greater than 3 Volts. In another embodiment, the channel mobility of the DMOSFET 32 is at least 40 $cm^2V^{-1}s^{-1}$ for control voltages greater than 2.5 Volts. In another embodiment, the channel mobility of the DMOSFET 32 is at least 60 $cm^2V^{-1}s^{-1}$ for control voltages greater than 4 Volts. In another embodiment, the channel mobility of the DMOSFET 32 is in a range of and including 40-75 $cm^2V^{-1}s^{-1}$ for control voltages greater than 2.5 Volts. In another embodiment, the channel mobility of the DMOSFET 32 is in a range of and including 50-75 $cm^2V^{-1}s^{-1}$ for control voltages greater than 3 Volts. In yet another embodiment, the channel mobility of the DMOSFET 32 is at least 50 $cm^2V^{-1}s^{-1}$ for control voltages in a range of and including 3 Volts to 15 Volts. Likewise, in other embodiments, the channel mobility of the DMOSFET 32 is at least 40 $cm^2V^{-1}s^{-1}$ for control voltages in a range of and including 2.5 Volts to 15 Volts, at least 60 $cm^2V^{-1}s^{-1}$ for control voltages in a range of and including 4 Volts to 15 Volts, in a range of and including 40-75 $cm^2V^{-1}s^{-1}$ for control voltages in a range of and including 2.5 Volts to 15 Volts, and in a range of and including 50-75 $cm^2V^{-1}s^{-1}$ for control voltages in a range of and including 3 Volts to 15 Volts.

The gate oxide 50 is preferably $SiO_2$, but is not limited thereto. For example, the gate oxide 50 may alternatively be formed of $Al_2O_3$, HfO, or similar dielectric material. A thickness of the gate oxide 50 may vary depending on the particular implementation. As one example, the thickness of the gate oxide 50 is in the range of and including 300 Angstroms to 1000 Angstroms. The gate contact 52 is preferably polysilicon, but is not limited thereto. The gate contact 52 may alternatively be formed of a metal such as, for example, Al. Lastly, the DMOSFET 32 includes a metal source contact 54 formed on the source region as illustrated. Likewise, a metal drain contact 56 is formed on a surface of the drain region opposite the drift layer 36 to provide a drain contact for the DMOSFET 32.

Figure 6:
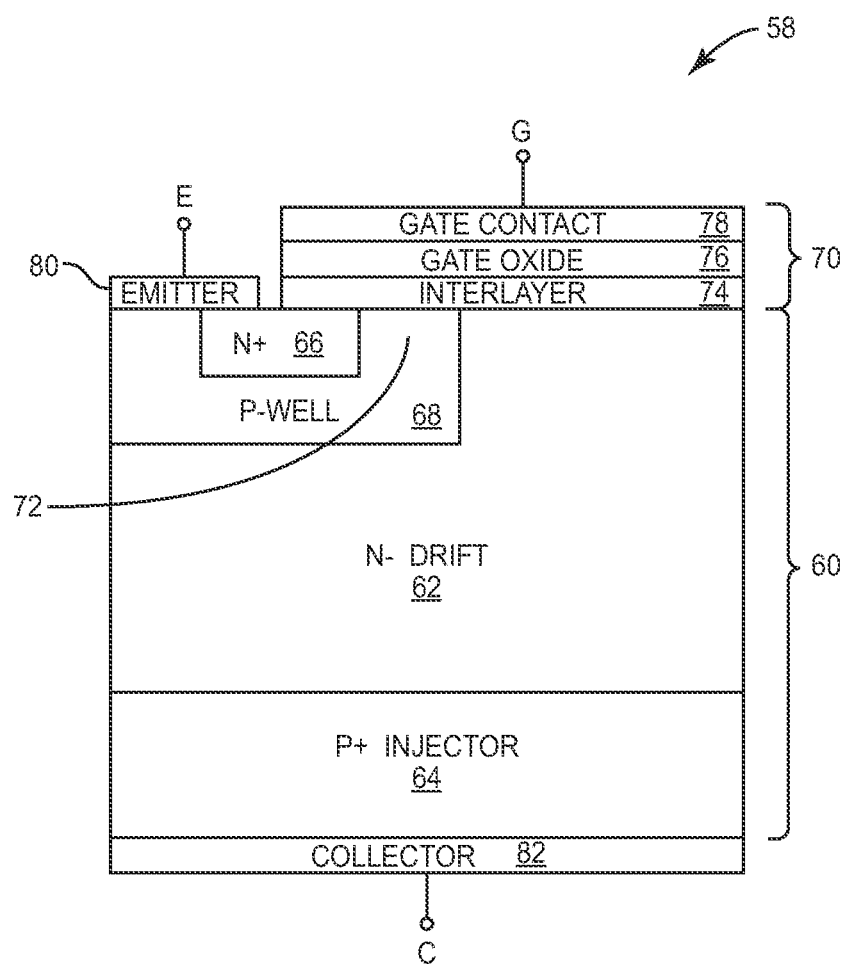
FIG. 6 illustrates an Insulated Gate Bipolar Transistor (IGBT) having a gate stack that includes an interlayer containing an alkaline earth metal according to one embodiment of the present disclosure.

FIG. 6 illustrates an IGBT 58 according to another embodiment of the present disclosure. As illustrated, the IGBT 58 includes a SiC substrate 60, which is preferably 4H-SiC. In this embodiment, the SiC substrate 60 includes a lightly doped n-type drift layer 62 and a highly doped p-type injector layer 64. The injector layer 64 may also be referred to herein as a collector region of the IGBT 58. The IGBT 58 also includes an n+ source region 66 formed in a p-type well 68, and a gate stack 70 arranged as shown. The gate stack 70 is formed over a channel region 72 of the IGBT 58 as shown. The gate stack 70 is the same as the gate stack 18 of FIG. 1. Specifically, the gate stack 70 includes an interlayer 74 on or directly on the surface of the substrate 60 over the channel region 72, a gate oxide 76 on or directly on the surface of the interlayer 74 opposite the substrate 60, and a gate contact 78 on or directly on the surface of the gate oxide 76 opposite the interlayer 74.

The interlayer 74 contains an alkaline earth metal. The alkaline earth metal is preferably Ba or Sr. However, other alkaline earth metals may be used. The interlayer 74 may be, for example:
- a layer of alkaline earth metal (e.g., a layer of Ba or Sr),
- multiple layers of the same or different alkaline earth metals (e.g., multiple layers of Ba or a layer of Ba followed by a layer of Sr), one or more layers of the same or different alkaline earth metals and one or more layers of the same or different oxides on or directly on the one or more layers of alkaline earth metal, one or more oxide layers containing an alkaline earth metal (e.g., BaO or $Ba_XSi_YO_Z$), an alkaline earth metal-oxide-alkaline earth metal structure containing one or more first layers of alkaline earth metal, one or more layers of oxide on or directly on the one or more first layers of alkaline earth metal, and one or more second layers of alkaline earth metal on or directly on the one or more layers of oxide opposite the one or more first layers of alkaline earth metal, or one or more oxynitride layers containing an alkaline earth metal (e.g., $BaO_XN_Y$).

In one exemplary embodiment, the interlayer 74 is $Ba_XSi_YO_Y$. In one embodiment, the interlayer 74 has a thickness in the range of and including 2 Angstroms to 15 Angstroms. Notably, the interlayer 74 may be formed using, for example, any of the dry or wet chemistry processes described above with respect to the interlayer 22.

As a result of the gate stack 70 including an alkaline earth metal, e.g., the interlayer 74 containing the alkaline earth metal, a channel mobility of the IGBT 58 is substantially greater than that of a conventional SiC IGBT (e.g., the same SiC IGBT but without the interlayer 74) without significantly lowering a threshold voltage of the IGBT 58. In one embodiment, the channel mobility of the IGBT 58 is at least two and a half times greater than that of the same IGBT without the interlayer 74 containing the alkaline earth metal. In another embodiment, the channel mobility of the IGBT 58 is at least 50 $cm^2V^{-1}s^{-1}$ for control voltages greater than 3 Volts. In another embodiment, the channel mobility of the IGBT 58 is at least 40 $cm^2V^{-1}s^{-1}$ for control voltages greater than 2.5 Volts. In another embodiment, the channel mobility of the IGBT 58 is at least 60 $cm^2V^{-1}s^{-1}$ for control voltages greater than 4 Volts. In another embodiment, the channel mobility of the IGBT 58 is in a range of and including 40-75 $cm^2V^{-1}s^{-1}$ for control voltages greater than 2.5 Volts. In another embodiment, the channel mobility of the IGBT 58 is in a range of and including 50-75 $cm^2V^{-1}s^{-1}$ for control voltages greater than 3 Volts. In yet another embodiment, the channel mobility of the IGBT 58 is at least 50 $cm^2V^{-1}s^{-1}$ for control voltages in a range of and including 3 Volts to 15 Volts. Likewise, in other embodiments, the channel mobility of the IGBT 58 is at least 40 $cm^2V^{-1}s^{-1}$ for control voltages in a range of and including 2.5 Volts to 15 Volts, at least 60 $cm^2V^{-1}s^{-1}$ for control voltages in a range of and including 4 Volts to 15 Volts, in a range of and including 40-75 $cm^2V^{-1}s^{-1}$ for control voltages in a range of and including 2.5 Volts to 15 Volts, and in a range of and including 50-75 $cm^2V^{-1}s^{-1}$ for control voltages in a range of and including 3 Volts to 15 Volts.

The gate oxide 76 is preferably $SiO_2$, but is not limited thereto. For example, the gate oxide 76 may alternatively be formed of $Al_2O_3$, HfO, or similar dielectric material. A thickness of the gate oxide 76 may vary depending on the particular implementation. As one example, the thickness of the gate oxide 76 is in the range of and including 300 Angstroms to 1000 Angstroms. The gate contact 78 is preferably polysilicon, but is not limited thereto. The gate contact 78 may alternatively be formed of a metal such as, for example, Al. Lastly, the IGBT 58 includes a metal emitter contact 80 formed over the n+ source region 66 as shown. Likewise, a metal collector contact 82 is formed on a surface of the injector layer 64 opposite the drift layer 62 to provide a collector contact for the IGBT 58.

Figure 7:
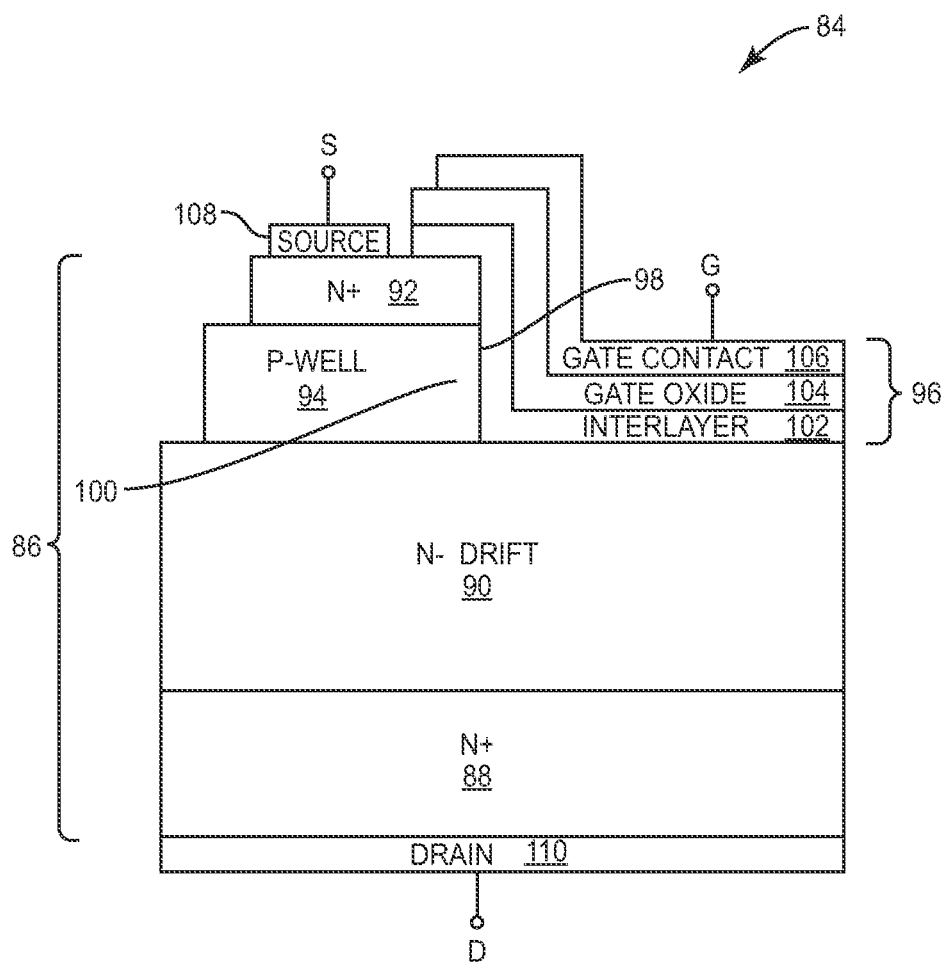
FIG. 7 illustrates a trench, or U-shaped, MOSFET having a gate stack that includes an interlayer containing an alkaline earth metal according to one embodiment of the present disclosure.

FIG. 7 illustrates a trench, or U-shaped, MOSFET 84 according to another embodiment of the present disclosure. As illustrated, the MOSFET 84 includes a SiC substrate 86, which is preferably 4H-SiC. In this embodiment, the SiC substrate 86 includes a highly doped n-type layer 88, a lightly doped n-type drift layer 90, a p-type well 94, and an n+ source region 92 formed in or on the p-type well 94. A gate stack 96 is formed in a trench 98 that extends through the n+ source region 92 and the p-type well 94 to the surface of the n-type drift layer 90. The gate stack 96 is formed over or adjacent to a channel region 100 of the MOSFET 84 as shown. The gate stack 96 is the same as the gate stack 18 of FIG. 1. Specifically, the gate stack 96 includes an interlayer 102 on or directly on the surface of the n-type drift layer 90, on or directly on the sidewalls of the trench 98, and partially on or directly on the surface of the n+ source region 92 on or adjacent to the channel region 100, a gate oxide 104 on or directly on the surface of the interlayer 102, and a gate contact 106 on or directly on the surface of the gate oxide 104 opposite the interlayer 102.

The interlayer 102 contains an alkaline earth metal. The alkaline earth metal is preferably Ba or Sr. However, other alkaline earth metals may be used. The interlayer 102 may be, for example:

a layer of alkaline earth metal (e.g., a layer of Ba or Sr), multiple layers of the same or different alkaline earth metals (e.g., multiple layers of Ba or a layer of Ba followed by a layer of Sr), one or more layers of the same or different alkaline earth metals and one or more layers of the same or different oxides on or directly on the one or more layers of alkaline earth metal, one or more oxide layers containing an alkaline earth metal (e.g., BaO or $Ba_XSi_YO_Z$), an alkaline earth metal-oxide-alkaline earth metal structure containing one or more first layers of alkaline earth metal, one or more layers of oxide on or directly on the one or more first layers of alkaline earth metal, and one or more second layers of alkaline earth metal on or directly on the one or more layers of oxide opposite the one or more first layers of alkaline earth metal, or one or more oxynitride layers containing an alkaline earth metal (e.g., $BaO_XN_Y$).

In one exemplary embodiment, the interlayer 102 is $Ba_XSi_YO_Y$. In one embodiment, the interlayer 102 has a thickness in the range of and including 2 Angstroms to 15 Angstroms. Notably, the interlayer 102 may be formed using, for example, any of the dry or wet chemistry processes described above with respect to the interlayer 22.

As a result of the gate stack 96 including an alkaline earth metal, e.g., the interlayer 102 containing the alkaline earth metal, a channel mobility of the MOSFET 84 is substantially greater than that of a conventional SiC trench MOSFET (e.g., the same SiC trench MOSFET but without the interlayer 102) without significantly lowering a threshold voltage of the MOSFET 84. In one embodiment, the channel mobility of the MOSFET 84 is at least two and a half times greater than that of the same MOSFET without the interlayer 102 containing the alkaline earth metal. In another embodiment, the channel mobility of the MOSFET 84 is at least 50 $cm^2V^{-1}s^{-1}$ for control voltages greater than 3 Volts. In another embodiment, the channel mobility of the MOSEFT 84 is at least 40 $cm^2V^{-1}s^{-1}$ for control voltages greater than 2.5 Volts. In another embodiment, the channel mobility of the MOSFET 84 is at least 60 $cm^2V^{-1}s^{-1}$ for control voltages greater than 4 Volts. In another embodiment, the channel mobility of the MOSFET 84 is in a range of and including 40-75 $cm^2V^{-1}s^{-1}$ for control voltages greater than 2.5 Volts. In another embodiment, the channel mobility of voltages greater than 3 Volts. In yet another embodiment, the channel mobility of the MOSFET 84 is at least 50 cm$^2$V$^{-1}$s$^{-1}$ for control voltages in a range of and including 3 Volts to 15 Volts. Likewise, in other embodiments, the channel mobility of the MOSFET 84 is at least 40 cm$^2$V$^{-1}$s$^{-1}$ for control voltages in a range of and including 2.5 Volts to 15 Volts, at least 60 cm$^2$V$^{-1}$s$^{-1}$ for control voltages in a range of and including 4 Volts to 15 Volts, in a range of and including 40-75 cm$^2$V$^{-1}$S$^{-1}$ for control voltages in a range of and including 2.5 Volts to 15 Volts, and in a range of and including 50-75 cm$^2$V$^{-1}$s$^{-1}$ for control voltages in a range of and including 3 Volts to 15 Volts.

The gate oxide 104 is preferably SiO$_2$, but is not limited thereto. For example, the gate oxide 104 may alternatively be formed of Al$_2$O$_3$, HfO, or similar dielectric material. A thickness of the gate oxide 104 may vary depending on the particular implementation. As one example, the thickness of the gate oxide 104 is in the range of and including 300 Angstroms to 1000 Angstroms. The gate contact 106 is preferably polysilicon, but is not limited thereto. The gate contact 106 may alternatively be formed of a metal such as, for example, Al. Lastly, the MOSFET 84 includes a metal source contact 108 formed over the n+ source region 92 as shown. Likewise, a metal drain contact 110 is formed on a second surface of the n-type layer 88 opposite the n-type drift layer 90 to provide a drain contact for the MOSFET 84.

Figure 8:
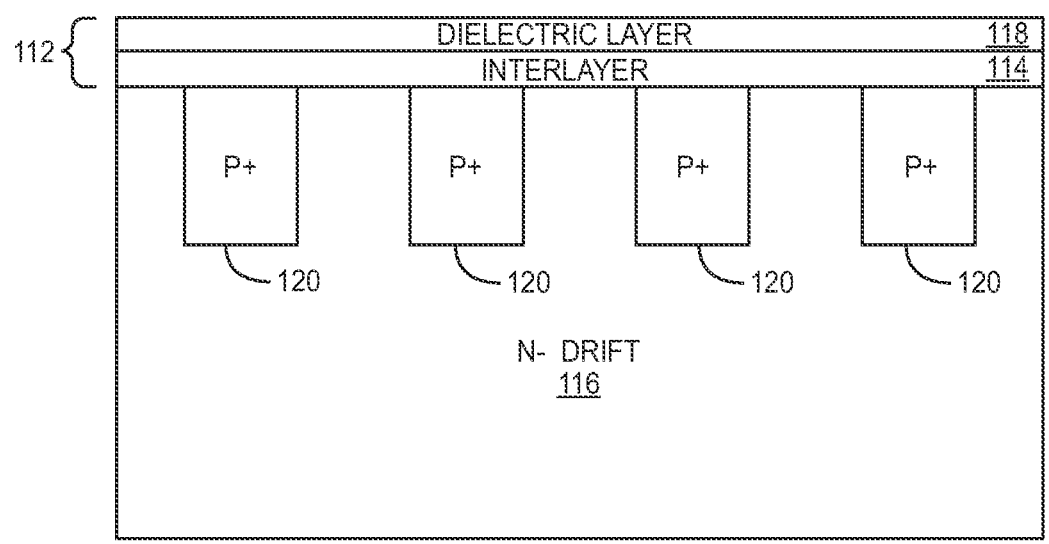
FIG. 8 illustrates a passivation structure for a semiconductor device that includes a dielectric layer and an interlayer containing an alkaline earth metal according to one embodiment of the present disclosure.

FIG. 8 illustrates a passivation structure 112 for a semiconductor device according to another embodiment of the present disclosure. The passivation structure 112 includes an interlayer 114 on or directly on a surface of a substrate 116 (which in this particular example is an n-type drift layer) and a dielectric layer 118 on or directly on a surface of the interlayer 114 opposite the substrate 116. In this particular embodiment, the passivation structure 112 is formed over a number of guard rings 120 that, as will be appreciated by one of ordinary skill in the art, provide an edge termination for one or more semiconductor devices formed on the substrate 116. However, the passivation structure 112 is not limited thereto. The interlayer 114 contains an alkaline earth metal. The alkaline earth metal is preferably Ba or Sr. However, other alkaline earth metals may be used. The interlayer 114 may be, for example:

a layer of alkaline earth metal (e.g., a layer of Ba or Sr),
multiple layers of the same or different alkaline earth metals (e.g., multiple layers of Ba or a layer of Ba followed by a layer of Sr),
one or more layers of the same or different alkaline earth metals and one or more layers of the same or different oxides on or directly on the one or more layers of alkaline earth metal,
one or more oxide layers containing an alkaline earth metal (e.g., BaO or Ba$_X$Si$_Y$O$_Z$),
an alkaline earth metal-oxide-alkaline earth metal structure containing one or more first layers of alkaline earth metal, one or more layers of oxide on or directly on the one or more first layers of alkaline earth metal, and one or more second layers of alkaline earth metal on or directly on the one or more layers of oxide opposite the one or more first layers of alkaline earth metal, or
one or more oxynitride layers containing an alkaline earth metal (e.g., BaO$_X$N$_Y$).

In one exemplary embodiment, the interlayer 114 is Ba$_X$Si$_Y$O$_Y$. Notably, the interlayer 114 may be formed using, for example, any of the dry or wet chemistry processes described above with respect to the interlayer 22. The interlayer 114 containing the alkaline earth metal provides a high quality interface, which in turn results in less interfacial charge trapping.

Figure 9:
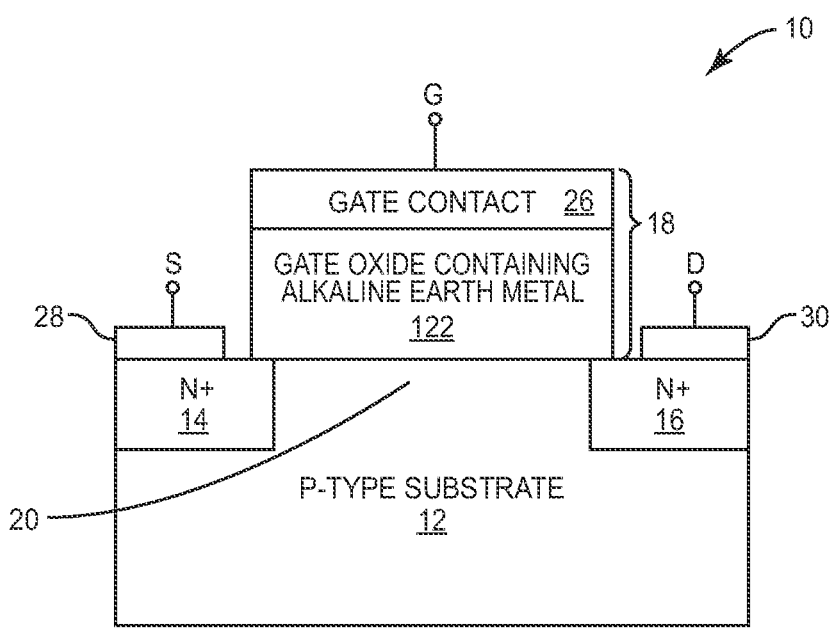
FIG. 9 illustrates a lateral MOSFET having a gate stack that includes a gate oxide containing an alkaline earth metal according to one embodiment of the present disclosure.

FIG. 9 illustrates the MOSFET 10 of FIG. 1 according to another embodiment of the present disclosure. As illustrated, the MOSFET 10 is substantially the same as that of FIG. 1. However, in this embodiment, the interlayer 22 and the gate oxide 24 are replaced with a gate oxide 122 containing an alkaline earth metal. In this embodiment, the alkaline earth metal is contained throughout the entirety of the gate oxide 122. The alkaline earth metal is preferably Ba or Sr. However, other alkaline earth metals may be used. In one exemplary embodiment, the gate oxide 122 is BaO. In another exemplary embodiment, the gate oxide 122 is Ba$_X$Si$_Y$O$_z$. In yet another embodiment, the gate oxide 122 may be an oxynitride containing an alkaline earth metal. Notably, the gate oxide 122 containing an alkaline earth metal may be formed using, for example, any of the dry or wet chemistry processes described above with respect to the interlayer 22 that are suitable for forming an oxide containing an alkaline earth metal.

As a result of the gate stack 18 including an alkaline earth metal, e.g., the gate oxide 122 containing the alkaline earth metal, a channel mobility of the MOSFET 10 is substantially greater than that of a conventional SiC MOSFET (e.g., the same SiC MOSFET but without the alkaline earth metal in the gate oxide) without significantly lowering a threshold voltage of the MOSFET 10. In one embodiment, the channel mobility of the MOSFET 10 is at least two and a half times greater than that of the same MOSFET without the gate oxide 122 containing the alkaline earth metal. In another embodiment, the channel mobility of the MOSFET 10 is at least 50 cm$^2$V$^{-1}$s$^{-1}$ for control voltages greater than 3 Volts. In another embodiment, the channel mobility of the MOSFET 10 is at least 40 cm$^2$V$^{-1}$s$^{-1}$ for control voltages greater than 2.5 Volts. In another embodiment, the channel mobility of the MOSFET 10 is at least 60 cm$^2$V$^{-1}$s$^{-1}$ for control voltages greater than 4 Volts. In another embodiment, the channel mobility of the MOSFET 10 is in a range of and including 40-75 cm$^2$V$^{-1}$s$^{-1}$ for control voltages greater than 2.5 Volts. In another embodiment, the channel mobility of the MOSFET 10 is in a range of and including 50-75 cm$^2$V$^{-1}$s$^{-1}$ for control voltages greater than 3 Volts. In yet another embodiment, the channel mobility of the MOSFET 10 is at least 50 cm$^2$V$^{-1}$s$^{-1}$ for control voltages in a range of and including 3 Volts to 15 Volts. Likewise, in other embodiments, the channel mobility of the MOSFET 10 is at least 40 cm$^2$V$^{-1}$s$^{-1}$ for control voltages in a range of and including 2.5 Volts to 15 Volts, at least 60 cm$^2$V$^{-1}$s$^{-1}$ for control voltages in a range of and including 4 Volts to 15 Volts, in a range of and including 40-75 cm$^2$V$^{-1}$S$^{-1}$ for control voltages in a range of and including 2.5 Volts to 15 Volts, and in a range of and including 50-75 cm$^2$V$^{-1}$s$^{-1}$ for control voltages in a range of and including 3 Volts to 15 Volts.

Figure 10:
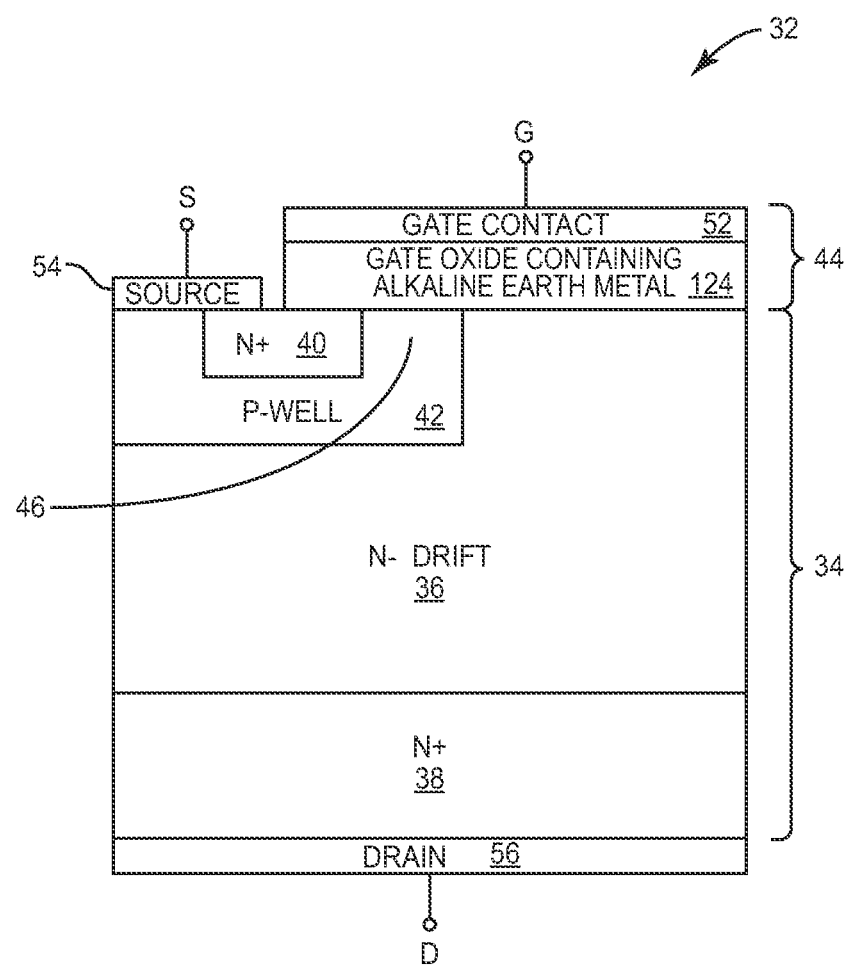
FIG. 10 illustrates a DMOSFET having a gate stack that includes a gate oxide containing an alkaline earth metal according to one embodiment of the present disclosure.

FIG. 10 illustrates the DMOSFET 32 of FIG. 5 according to another embodiment of the present disclosure. As illustrated, the DMOSFET 32 is substantially the same as that of FIG. 5. However, in this embodiment, the interlayer 48 and the gate oxide 50 are replaced with a gate oxide 124 containing an alkaline earth metal. In this embodiment, the alkaline earth metal is contained throughout the entirety of the gate oxide 124. The alkaline earth metal is preferably Ba or Sr. However, other alkaline earth metals may be used. In one exemplary embodiment, the gate oxide 124 is BaO. In another exemplary embodiment, the gate oxide 124 is Ba$_X$Si$_Y$O$_z$. In yet another embodiment, the gate oxide 124 may be an oxynitride containing an alkaline earth metal. Notably, the gate oxide 124 containing an alkaline earth metal may be formed using, for example, any of the dry or wet chemistry processes described above with respect to the interlayer 22 that are suitable for forming an oxide containing an alkaline earth metal.

As a result of the gate stack 44 including an alkaline earth metal, e.g., the gate oxide 124 containing the alkaline earth metal, a channel mobility of the DMOSFET 32 is substantially greater than that of a conventional SiC DMOSFET (e.g., the same SiC DMOSFET but without the alkaline earth metal in the gate oxide) without significantly lowering a threshold voltage of the DMOSFET 32. In one embodiment, the channel mobility of the DMOSFET 32 is at least two and a half times greater than that of the same DMOSFET without the gate oxide 124 containing the alkaline earth metal. In another embodiment, the channel mobility of the DMOSFET 32 is at least 50 cm$^2$V$^{-1}$s$^{-1}$ for control voltages greater than 3 Volts. In another embodiment, the channel mobility of the DMOSFET 32 is at least 40 cm$^2$V$^{-1}$s$^{-1}$ for control voltages greater than 2.5 Volts. In another embodiment, the channel mobility of the DMOSFET 32 is at least 60 cm$^2$V$^{-1}$s$^{-1}$ for control voltages greater than 4 Volts. In another embodiment, the channel mobility of the DMOSFET 32 is in a range of and including 40-75 cm$^2$V$^{-1}$s$^{-1}$ for control voltages greater than 2.5 Volts. In another embodiment, the channel mobility of the DMOSFET 32 is in a range of and including 50-75 cm$^2$V$^{-1}$s$^{-1}$ for control voltages greater than 3 Volts. In yet another embodiment, the channel mobility of the DMOSFET 32 is at least 50 cm$^2$V$^{-1}$s$^{-1}$ for control voltages in a range of and including 3 Volts to 15 Volts. Likewise, in other embodiments, the channel mobility of the DMOSFET 32 is at least 40 cm$^2$V$^{-1}$s$^{-1}$ for control voltages in a range of and including 2.5 Volts to 15 Volts, at least 60 cm$^2$V$^{-1}$s$^{-1}$ for control voltages in a range of and including 4 Volts to 15 Volts, in a range of and including 40-75 cm$^2$V$^{-1}$s$^{-1}$ for control voltages in a range of and including 2.5 Volts to 15 Volts, and in a range of and including 50-75 cm$^2$V$^{-1}$s$^{-1}$ for control voltages in a range of and including 3 Volts to 15 Volts.

Figure 11:
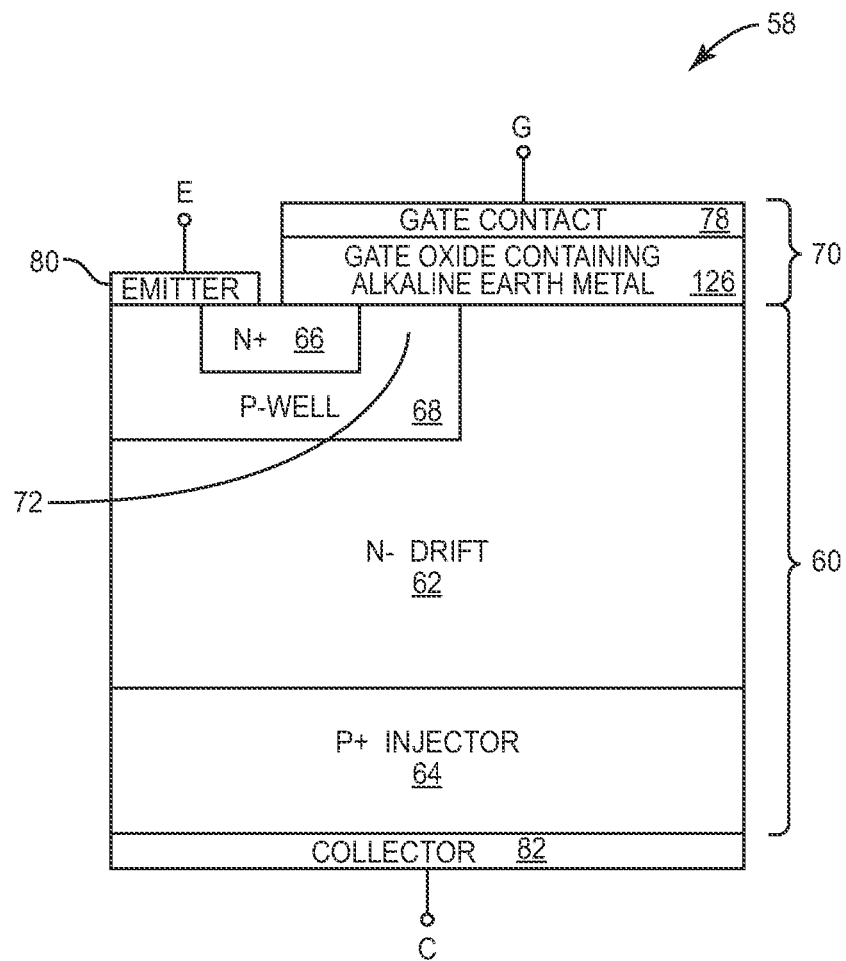
FIG. 11 illustrates an IGBT having a gate stack that includes a gate oxide containing an alkaline earth metal according to one embodiment of the present disclosure.

FIG. 11 illustrates the IGBT 58 of FIG. 6 according to another embodiment of the present disclosure. As illustrated, the IGBT 58 is substantially the same as that of FIG. 6. However, in this embodiment, the interlayer 74 and the gate oxide 76 are replaced with a gate oxide 126 containing an alkaline earth metal. In this embodiment, the alkaline earth metal is contained throughout the entirety of the gate oxide 126. The alkaline earth metal is preferably Ba or Sr. However, other alkaline earth metals may be used. In one exemplary embodiment, the gate oxide 126 is BaO. In another exemplary embodiment, the gate oxide 126 is Ba$_x$Si$_y$O$_z$. In yet another embodiment, the gate oxide 126 may be an oxynitride containing an alkaline earth metal. Notably, the gate oxide 126 containing an alkaline earth metal may be formed using, for example, any of the dry or wet chemistry processes described above with respect to the interlayer 22 that are suitable for forming an oxide containing an alkaline earth metal.

As a result of the gate stack 70 including an alkaline earth metal, e.g., the gate oxide 126 containing the alkaline earth metal, a channel mobility of the IGBT 58 is substantially greater than that of a conventional SiC IGBT (e.g., the same SiC IGBT but without the alkaline earth metal in the gate oxide) without significantly lowering a threshold voltage of the IGBT 58. In one embodiment, the channel mobility of the IGBT 58 is at least two and a half times greater than that of the same IGBT without the gate oxide 126 containing the alkaline earth metal. In another embodiment, the channel mobility of the IGBT 58 is at least 50 cm$^2$V$^{-1}$s$^{-1}$ for control voltages greater than 3 Volts. In another embodiment, the channel mobility of the IGBT 58 is at least 40 cm$^2$V$^{-1}$s$^{-1}$ for control voltages greater than 2.5 Volts. In another embodiment, the channel mobility of the IGBT 58 is at least 60 cm$^2$V$^{-1}$s$^{-1}$ for control voltages greater than 4 Volts. In another embodiment, the channel mobility of the IGBT 58 is in a range of and including 40-75 cm$^2$V$^{-1}$s$^{-1}$ for control voltages greater than 2.5 Volts. In another embodiment, the channel mobility of the IGBT 58 is in a range of and including 50-75 cm$^2$V$^{-1}$s$^{-1}$ for control voltages greater than 3 Volts. In yet another embodiment, the channel mobility of the IGBT 58 is at least 50 cm$^2$V$^{-1}$s$^{-1}$ for control voltages in a range of and including 3 Volts to 15 Volts. Likewise, in other embodiments, the channel mobility of the IGBT 58 is at least 40 cm$^2$V$^{-1}$s$^{-1}$ for control voltages in a range of and including 2.5 Volts to 15 Volts, at least 60 cm$^2$V$^{-1}$S$^{-1}$ for control voltages in a range of and including 4 Volts to 15 Volts, in a range of and including 40-75 cm$^2$V$^{-1}$s$^{-1}$ for control voltages in a range of and including 2.5 Volts to 15 Volts, and in a range of and including 50-75 cm$^2$V$^{-1}$s$^{-1}$ for control voltages in a range of and including 3 Volts to 15 Volts.

Figure 12:
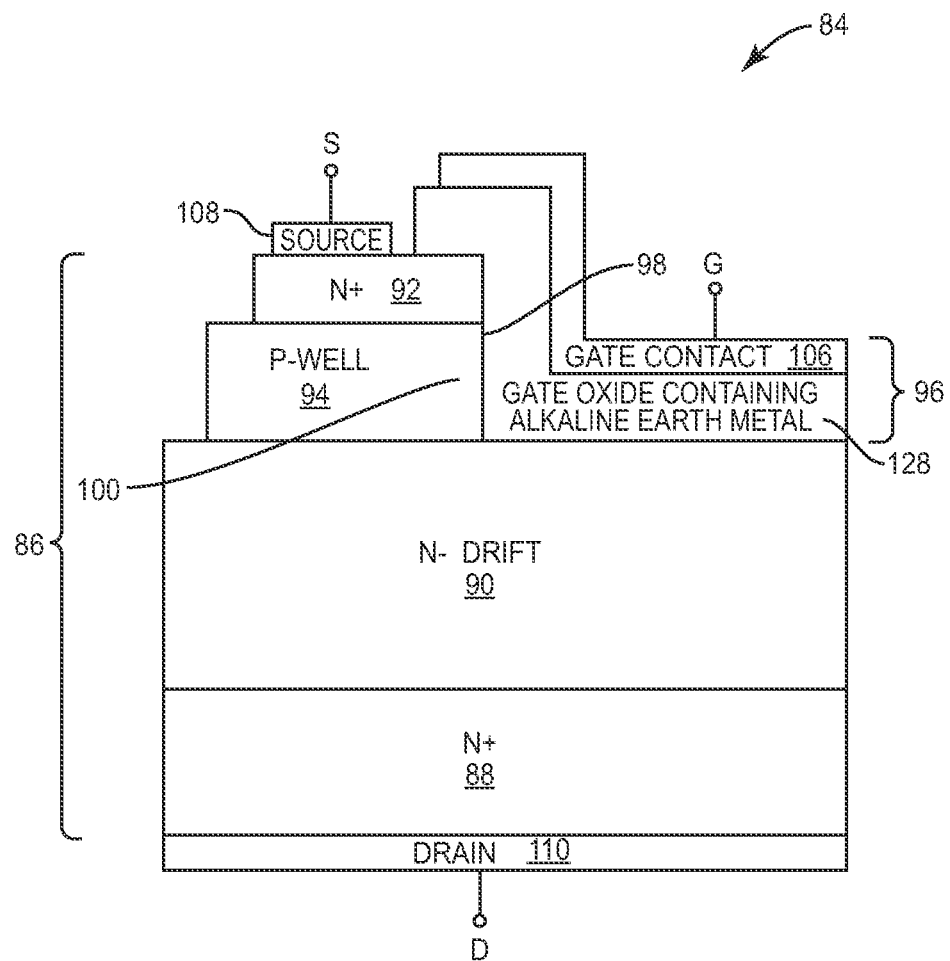
FIG. 12 illustrates a trench, or U-shaped, MOSFET having a gate stack that includes a gate oxide containing an alkaline earth metal according to one embodiment of the present disclosure.

FIG. 12 illustrates the trench, or U-shaped, MOSFET 84 of FIG. 7 according to another embodiment of the present disclosure. As illustrated, the MOSFET 84 is substantially the same as that of FIG. 7. However, in this embodiment, the interlayer 102 and the gate oxide 104 are replaced with a gate oxide 128 containing an alkaline earth metal. In this embodiment, the alkaline earth metal is contained throughout the entirety of the gate oxide 128. The alkaline earth metal is preferably Ba or Sr. However, other alkaline earth metals may be used. In one exemplary embodiment, the gate oxide 128 is BaO. In another exemplary embodiment, the gate oxide 128 is Ba$_x$Si$_y$O$_z$. In yet another embodiment, the gate oxide 128 may be an oxynitride containing an alkaline earth metal. Notably, the gate oxide 128 containing an alkaline earth metal may be formed using, for example, any of the dry or wet chemistry processes described above with respect to the interlayer 22 that are suitable for forming an oxide containing an alkaline earth metal.

As a result of the gate stack 96 including an alkaline earth metal, e.g., the gate oxide 128 containing the alkaline earth metal, a channel mobility of the MOSFET 84 is substantially greater than that of a conventional SiC trench MOSFET (e.g., the same SiC trench MOSFET but without the alkaline earth metal in the gate oxide) without significantly lowering a threshold voltage of the MOSFET 84. In one embodiment, the channel mobility of the MOSFET 84 is at least two and a half times greater than that of the same MOSFET without the gate oxide 128 containing the alkaline earth metal. In another embodiment, the channel mobility of the MOSFET 84 is at least 50 cm$^2$V$^{-1}$s$^{-1}$ for control voltages greater than 3 Volts. In another embodiment, the channel mobility of the MOSEFT 84 is at least 40 cm$^2$V$^{-1}$s$^{-1}$ for control voltages greater than 2.5 Volts. In another embodiment, the channel mobility of the MOSFET 84 is at least 60 cm$^2$V$^{-1}$s$^{-1}$ for control voltages greater than 4 Volts. In another embodiment, the channel mobility of the MOSFET 84 is in a range of and including 40-75 cm$^2$V$^{-1}$s$^{-1}$ for control voltages greater than 2.5 Volts. In another embodiment, the channel mobility of the MOSFET 84 is in a range of and including 50-75 cm$^2$V$^{-1}$s$^{-1}$ for control voltages greater than 3 Volts. In yet another embodiment, the channel mobility of the MOSFET 84 is at least 50 cm$^2$V$^{-1}$s$^{-1}$ for control voltages in a range of and including 3 Volts to 15 Volts. Likewise, in other embodiments, the channel mobility of the MOSFET 84 is at least 40 cm$^2$V$^{-1}$s$^{-1}$ for control voltages in a range of and including 2.5 Volts to 15 Volts, at least 60 cm$^2$V$^{-1}$s$^{-1}$ for control voltages in a range of and including 4 Volts to 15 Volts, in a range of and including 40-75 cm$^2$V$^{-1}$s$^{-1}$ for control voltages in a range of and including 2.5

Volts to 15 Volts, and in a range of and including 50-75 $cm^2V^{-1}s^{-1}$ for control voltages in a range of and including 3 Volts to 15 Volts.

Figure 13:
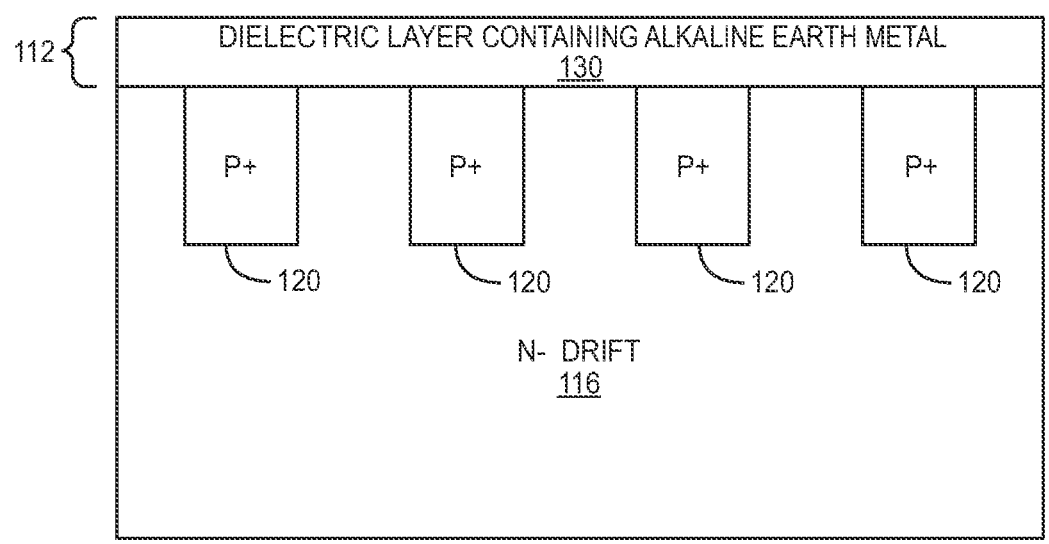
FIG. 13 illustrates a passivation structure for a semiconductor device that includes a dielectric layer containing an alkaline earth metal according to one embodiment of the present disclosure.

FIG. 13 illustrates the passivation structure 112 of FIG. 8 according to another embodiment of the present disclosure. In this embodiment, rather than including the interlayer 114 and the dielectric layer 118 (FIG. 8), the passivation structure 112 includes a dielectric layer 130 containing an alkaline earth metal. The alkaline earth metal is preferably Ba or Sr. However, other alkaline earth metals may be used. In one exemplary embodiment, the dielectric layer 130 is $Ba_xSi_yO_Y$. In another embodiment, the dielectric layer 130 is an oxynitride containing an alkaline earth metal such as, for example, $BaO_XN_Y$. Notably, the dielectric layer 130 containing an alkaline earth metal may be formed using, for example, any of the dry or wet chemistry processes described above with respect to the interlayer 22 that are suitable for forming a dielectric layer containing an alkaline earth metal. The dielectric layer 130 containing the alkaline earth metal provides a high quality interface, which in turn results in less interfacial charge trapping.

Figure 14:
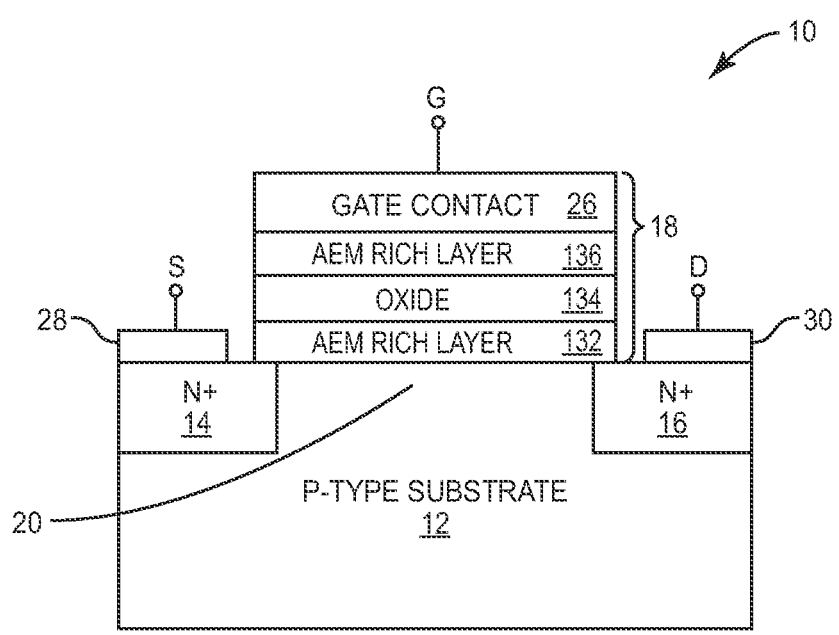
FIG. 14 illustrates a lateral MOSFET having a gate stack that includes an alkaline earth metal-oxide-alkaline earth metal structure according to one embodiment of the present disclosure.

FIG. 14 illustrates the MOSFET 10 of FIG. 1 according to yet another embodiment of the present disclosure. As illustrated, the MOSFET 10 is substantially the same as that of FIG. 1. However, in this embodiment, the interlayer 22 and the gate oxide 24 are replaced with an alkaline earth metal-oxide-alkaline earth metal structure formed by a first alkaline earth metal (AEM) rich layer 132 on or directly on the substrate 12 over the channel region 20, an oxide layer 134 on or directly on the first AEM rich layer 132 opposite the substrate 12, and a second AEM rich layer 136 on a surface of the oxide layer 134 opposite the first AEM rich layer 132. The AEM rich layers 132 and 136 contain the same or different alkaline earth metals, which are preferably Ba or Sr. However, other alkaline earth metals may be used. Each of the AEM rich layers 132 and 136 may be, for example:
   a layer of alkaline earth metal (e.g., a layer of Ba or Sr),
   multiple layers of the same or different alkaline earth metals (e.g., multiple layers of Ba or a layer of Ba followed by a layer of Sr),
   one or more layers of the same or different alkaline earth metals and one or more layers of the same or different oxides on or directly on the one or more layers of alkaline earth metal,
   one or more oxide layers containing an alkaline earth metal (e.g., BaO or $Ba_xSi_yO_Z$), or
   one or more oxynitride layers containing an alkaline earth metal (e.g., $BaO_XN_Y$).

In one exemplary embodiment, each of the AEM rich layers 132 and 136 is BaO. In another exemplary embodiment, each of the AEM rich layers 132 and 136 is $Ba_xSi_yO_z$. Notably, the first and second AEM rich layers 132 and 136 may be formed using, for example, any of the dry or wet chemistry processes described above with respect to the interlayer 22 that are suitable for forming the AEM rich layers 132 and 136.

As a result of the gate stack 18 including an alkaline earth metal, e.g., the alkaline earth metal-oxide-alkaline earth metal structure containing the first and second AEM layers 132 and 136, a channel mobility of the MOSFET 10 is substantially greater than that of a conventional SiC MOSFET (e.g., the same SiC MOSFET but without the alkaline earth metal-oxide-alkaline earth metal structure) without significantly lowering a threshold voltage of the MOSFET 10. In one embodiment, the channel mobility of the MOSFET 10 is at least two and a half times greater than that of the same MOSFET without the alkaline earth metal-oxide-alkaline earth metal structure. In another embodiment, the channel mobility of the MOSFET 10 is at least 50 $cm^2V^{-1}s^{-1}$ for control voltages greater than 3 Volts. In another embodiment, the channel mobility of the MOSFET 10 is at least 40 $cm^2V^{-1}s^{-1}$ for control voltages greater than 2.5 Volts. In another embodiment, the channel mobility of the MOSFET 10 is at least 60 $cm^2V^{-1}s^{-1}$ for control voltages greater than 4 Volts. In another embodiment, the channel mobility of the MOSFET 10 is in a range of and including 40-75 $cm^2V^{-1}s^{-1}$ for control voltages greater than 2.5 Volts. In another embodiment, the channel mobility of the MOSFET 10 is in a range of and including 50-75 $cm^2V^{-1}s^{-1}$ for control voltages greater than 3 Volts. In yet another embodiment, the channel mobility of the MOSFET 10 is at least 50 $cm^2V^{-1}s^{-1}$ for control voltages in a range of and including 3 Volts to 15 Volts. Likewise, in other embodiments, the channel mobility of the MOSFET 10 is at least 40 $cm^2V^{-1}s^{-1}$ for control voltages in a range of and including 2.5 Volts to 15 Volts, at least 60 $cm^2V^{-1}s^{-1}$ for control voltages in a range of and including 4 Volts to 15 Volts, in a range of and including 40-75 $cm^2V^{-1}S^{-1}$ for control voltages in a range of and including 2.5 Volts to 15 Volts, and in a range of and including 50-75 $cm^2V^{-1}s^{-1}$ for control voltages in a range of and including 3 Volts to 15 Volts.

Figure 15:
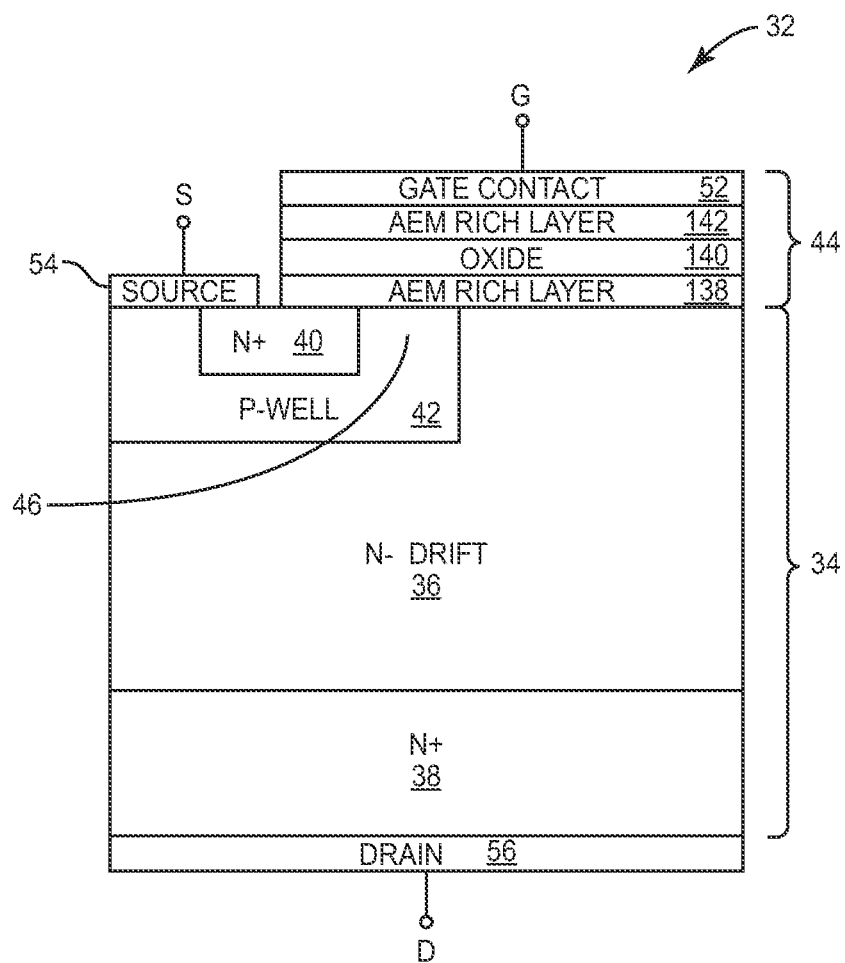
FIG. 15 illustrates a DMOSFET having a gate stack that includes an alkaline earth metal-oxide-alkaline earth metal structure according to one embodiment of the present disclosure.

FIG. 15 illustrates the DMOSFET 32 of FIG. 5 according to yet another embodiment of the present disclosure. As illustrated, the DMOSFET 32 is substantially the same as that of FIG. 5. However, in this embodiment, the interlayer 48 and the gate oxide 50 are replaced with an alkaline earth metal-oxide-alkaline earth metal structure formed by a first AEM rich layer 138 on or directly on the substrate 34 over the channel region 46, an oxide layer 140 on or directly on the first AEM rich layer 138 opposite the substrate 34, and a second AEM rich layer 142 on a surface of the oxide layer 140 opposite the first AEM rich layer 138. The AEM rich layers 138 and 142 contain the same or different alkaline earth metals, which are preferably Ba or Sr. However, other alkaline earth metals may be used. Each of the AEM rich layers 138 and 142 may be, for example:
   a layer of alkaline earth metal (e.g., a layer of Ba or Sr),
   multiple layers of the same or different alkaline earth metals (e.g., multiple layers of Ba or a layer of Ba followed by a layer of Sr),
   one or more layers of the same or different alkaline earth metals and one or more layers of the same or different oxides on or directly on the one or more layers of alkaline earth metal,
   one or more oxide layers containing an alkaline earth metal (e.g., BaO or $Ba_xSi_yO_Z$), or
   one or more oxynitride layers containing an alkaline earth metal (e.g., $BaO_XN_Y$).

In one exemplary embodiment, each of the AEM rich layers 138 and 142 is BaO. In another exemplary embodiment, each of the AEM rich layers 138 and 142 is $Ba_xSi_yO_z$. Notably, the first and second AEM rich layers 138 and 142 may be formed using, for example, any of the dry or wet chemistry processes described above with respect to the interlayer 22 that are suitable for forming the AEM rich layers 138 and 142.

As a result of the gate stack 44 including an alkaline earth metal, e.g., the alkaline earth metal-oxide-alkaline earth metal structure containing the first and second AEM layers 138 and 142, a channel mobility of the DMOSFET 32 is substantially greater than that of a conventional SiC DMOSFET (e.g., the same SiC DMOSFET but without the alkaline earth metal-oxide-alkaline earth metal structure) without significantly lowering a threshold voltage of the DMOSFET 32. In one embodiment, the channel mobility of the DMOSFET 32 is at least two and a half times greater than that of the same DMOSFET without the alkaline earth metal-oxide-alkaline earth metal structure. In another embodiment, the channel mobility of the DMOSFET 32 is at least 50 cm$^2$V$^{-1}$s$^{-1}$ for control voltages greater than 3 Volts. In another embodiment, the channel mobility of the DMOSFET 32 is at least 40 cm$^2$V$^{-1}$s$^{-1}$ for control voltages greater than 2.5 Volts. In another embodiment, the channel mobility of the DMOSFET 32 is at least 60 cm$^2$V$^{-1}$s$^{-1}$ for control voltages greater than 4 Volts. In another embodiment, the channel mobility of the DMOSFET 32 is in a range of and including 40-75 cm$^2$V$^{-1}$s$^{-1}$ for control voltages greater than 2.5 Volts. In another embodiment, the channel mobility of the DMOSFET 32 is in a range of and including 50-75 cm$^2$V$^{-1}$s$^{-1}$ for control voltages greater than 3 Volts. In yet another embodiment, the channel mobility of the DMOSFET 32 is at least 50 cm$^2$V$^{-1}$s$^{-1}$ for control voltages in a range of and including 3 Volts to 15 Volts. Likewise, in other embodiments, the channel mobility of the DMOSFET 32 is at least 40 cm$^2$V$^{-1}$s$^{-1}$ for control voltages in a range of and including 2.5 Volts to 15 Volts, at least 60 cm$^2$V$^{-1}$s$^{-1}$ for control voltages in a range of and including 4 Volts to 15 Volts, in a range of and including 40-75 cm$^2$V$^{-1}$s$^{-1}$ for control voltages in a range of and including 2.5 Volts to 15 Volts, and in a range of and including 50-75 cm$^2$V$^{-1}$s$^{-1}$ for control voltages in a range of and including 3 Volts to 15 Volts.

Figure 16:
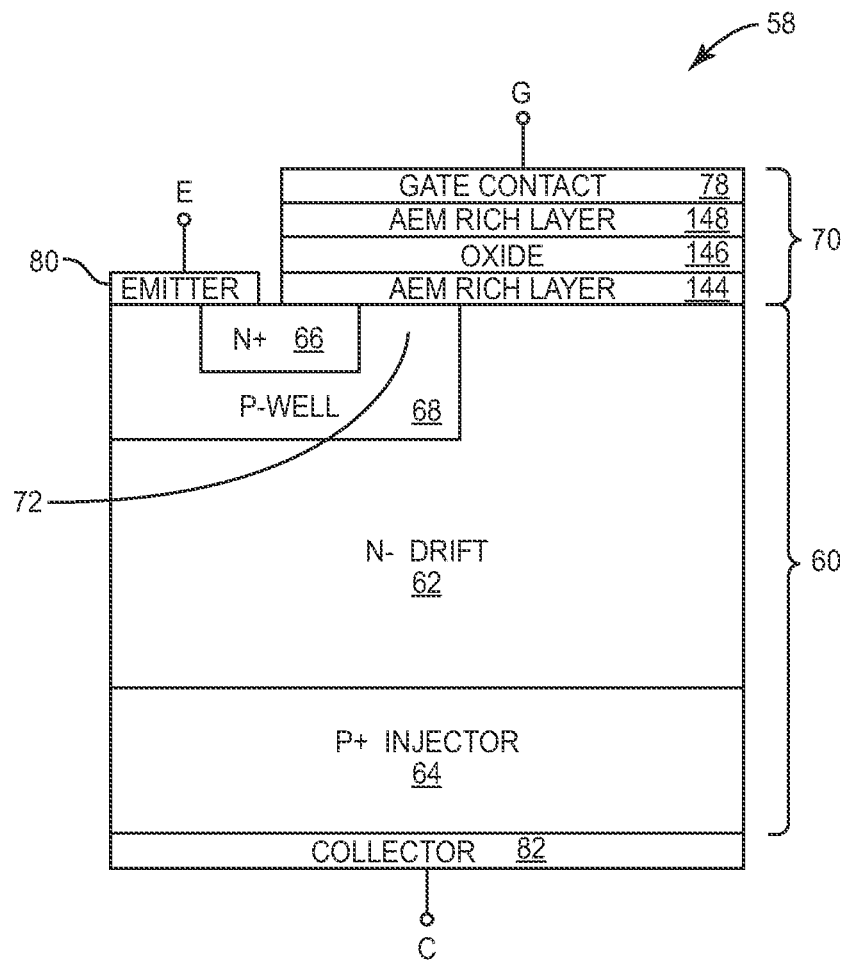
FIG. 16 illustrates an IGBT having a gate stack that includes an alkaline earth metal-oxide-alkaline earth metal structure according to one embodiment of the present disclosure.

FIG. 16 illustrates the IGBT 58 of FIG. 6 according to yet another embodiment of the present disclosure. As illustrated, the IGBT 58 is substantially the same as that of FIG. 6. However, in this embodiment, the interlayer 74 and the gate oxide 76 are replaced with an alkaline earth metal-oxide-alkaline earth metal structure formed by a first AEM rich layer 144 on or directly on the substrate 60 over the channel region 72, an oxide layer 146 on or directly on the first AEM rich layer 144 opposite the substrate 60, and a second AEM rich layer 148 on a surface of the oxide layer 146 opposite the first AEM rich layer 144. The AEM rich layers 144 and 148 contain the same or different alkaline earth metals, which are preferably Ba or Sr. However, other alkaline earth metals may be used. Each of the AEM rich layers 144 and 148 may be, for example:

a layer of alkaline earth metal (e.g., a layer of Ba or Sr),
    multiple layers of the same or different alkaline earth metals (e.g., multiple layers of Ba or a layer of Ba followed by a layer of Sr),
    one or more layers of the same or different alkaline earth metals and one or more layers of the same or different oxides on or directly on the one or more layers of alkaline earth metal,
    one or more oxide layers containing an alkaline earth metal (e.g., BaO or Ba$_X$Si$_Y$O$_Z$), or
    one or more oxynitride layers containing an alkaline earth metal (e.g., BaO$_X$N$_Y$).

In one exemplary embodiment, each of the AEM rich layers 144 and 148 is BaO. In another exemplary embodiment, each of the AEM rich layers 144 and 148 is Ba$_X$Si$_Y$O$_Z$. Notably, the first and second AEM rich layers 144 and 148 may be formed using, for example, any of the dry or wet chemistry processes described above with respect to the interlayer 22 that are suitable for forming the AEM rich layers 144 and 148.

As a result of the gate stack 70 including an alkaline earth metal, e.g., the alkaline earth metal-oxide-alkaline earth metal structure containing the first and second AEM layers 144 and 148, a channel mobility of the IGBT 58 is substantially greater than that of a conventional SiC IGBT (e.g., the same SiC IGBT but without the alkaline earth metal-oxide-alkaline earth metal structure) without significantly lowering a threshold voltage of the IGBT 58. In one embodiment, the channel mobility of the IGBT 58 is at least two and a half times greater than that of the same IGBT without the alkaline earth metal-oxide-alkaline earth metal structure. In another embodiment, the channel mobility of the IGBT 58 is at least 50 cm$^2$V$^{-1}$s$^{-1}$ for control voltages greater than 3 Volts. In another embodiment, the channel mobility of the IGBT 58 is at least 40 cm$^2$V$^{-1}$s$^{-1}$ for control voltages greater than 2.5 Volts. In another embodiment, the channel mobility of the IGBT 58 is at least 60 cm$^2$V$^{-1}$s$^{-1}$ for control voltages greater than 4 Volts. In another embodiment, the channel mobility of the IGBT 58 is in a range of and including 40-75 cm$^2$V$^{-1}$s$^{-1}$ for control voltages greater than 2.5 Volts. In another embodiment, the channel mobility of the IGBT 58 is in a range of and including 50-75 cm$^2$V$^{-1}$s$^{-1}$ for control voltages greater than 3 Volts. In yet another embodiment, the channel mobility of the IGBT 58 is at least 50 cm$^2$V$^{-1}$s$^{-1}$ for control voltages in a range of and including 3 Volts to 15 Volts. Likewise, in other embodiments, the channel mobility of the IGBT 58 is at least 40 cm$^2$V$^{-1}$s$^{-1}$ for control voltages in a range of and including 2.5 Volts to 15 Volts, at least 60 cm$^2$V$^{-1}$S$^{-1}$ for control voltages in a range of and including 4 Volts to 15 Volts, in a range of and including 40-75 cm$^2$V$^{-1}$s$^{-1}$ for control voltages in a range of and including 2.5 Volts to 15 Volts, and in a range of and including 50-75 cm$^2$V$^{-1}$s$^{-1}$ for control voltages in a range of and including 3 Volts to 15 Volts.

Figure 17:
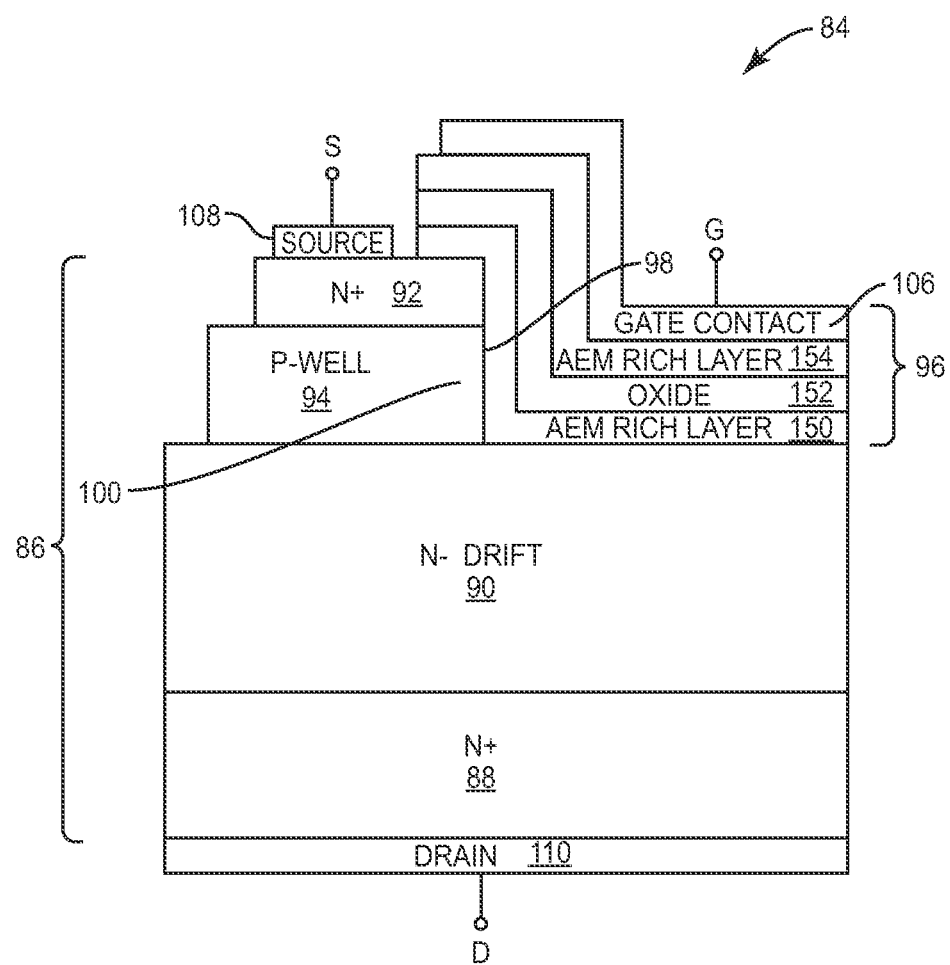
FIG. 17 illustrates a trench, or U-shaped, MOSFET having an alkaline earth metal-oxide-alkaline earth metal structure according to one embodiment of the present disclosure.

FIG. 17 illustrates the trench, or U-shaped, MOSFET 84 of FIG. 7 according to yet another embodiment of the present disclosure. As illustrated, the MOSFET 84 is substantially the same as that of FIG. 7. However, in this embodiment, the interlayer 102 and the gate oxide 104 are replaced with an alkaline earth metal-oxide-alkaline earth metal structure formed by a first AEM rich layer 150 on or directly on the substrate 86 within the trench 98, an oxide layer 152 on or directly on the first AEM rich layer 150 opposite the substrate 86, and a second AEM rich layer 154 on a surface of the oxide layer 152 opposite the first AEM rich layer 150. The AEM rich layers 150 and 154 contain the same or different alkaline earth metals, which are preferably Ba or Sr. However, other alkaline earth metals may be used. Each of the AEM rich layers 150 and 154 may be, for example:

a layer of alkaline earth metal (e.g., a layer of Ba or Sr),
    multiple layers of the same or different alkaline earth metals (e.g., multiple layers of Ba or a layer of Ba followed by a layer of Sr),
    one or more layers of the same or different alkaline earth metals and one or more layers of the same or different oxides on or directly on the one or more layers of alkaline earth metal,
    one or more oxide layers containing an alkaline earth metal (e.g., BaO or Ba$_X$Si$_Y$O$_Z$), or
    one or more oxynitride layers containing an alkaline earth metal (e.g., BaO$_X$N$_Y$).

In one exemplary embodiment, each of the AEM rich layers 150 and 154 is BaO. In another exemplary embodiment, each of the AEM rich layers 150 and 154 is Ba$_X$Si$_Y$O$_Z$. Notably, the first and second AEM rich layers 150 and 154 may be formed using, for example, any of the dry or wet chemistry processes described above with respect to the interlayer 22 that are suitable for forming the AEM rich layers 150 and 154.

As a result of the gate stack 96 including an alkaline earth metal, e.g., the alkaline earth metal-oxide-alkaline earth metal structure containing the first and second AEM layers 150 and 154, a channel mobility of the MOSFET 84 is substantially greater than that of a conventional SiC trench MOSFET (e.g., the same SiC trench MOSFET but without the alkaline earth metal-oxide-alkaline earth metal structure) without significantly lowering a threshold voltage of the MOSFET 84. In one embodiment, the channel mobility of the MOSFET 84 is at least two and a half times greater than that of the same MOSFET without the alkaline earth metal-oxide-alkaline earth metal structure. In another embodiment, the channel mobility of the MOSFET 84 is at least 50 cm$^2$V$^{-1}$s$^{-1}$ for control voltages greater than 3 Volts. In another embodiment, the channel mobility of the MOSEFT 84 is at least 40 cm$^2$V$^{-1}$s$^{-1}$ for control voltages greater than 2.5 Volts. In another embodiment, the channel mobility of the MOSFET 84 is at least 60 cm$^2$V$^{-1}$s$^{-1}$ for control voltages greater than 4 Volts. In another embodiment, the channel mobility of the MOSFET 84 is in a range of and including 40-75 cm$^2$V$^{-1}$S$^{-1}$ for control voltages greater than 2.5 Volts. In another embodiment, the channel mobility of the MOSFET 84 is in a range of and including 50-75 cm$^2$V$^{-1}$s$^{-1}$ for control voltages greater than 3 Volts. In yet another embodiment, the channel mobility of the MOSFET 84 is at least 50 cm$^2$V$^{-1}$s$^{-1}$ for control voltages in a range of and including 3 Volts to 15 Volts. Likewise, in other embodiments, the channel mobility of the MOSFET 84 is at least 40 cm$^2$V$^{-1}$s$^{-1}$ for control voltages in a range of and including 2.5 Volts to 15 Volts, at least 60 cm$^2$V$^{-1}$s$^{-1}$ for control voltages in a range of and including 4 Volts to 15 Volts, in a range of and including 40-75 cm$^2$V$^{-1}$S$^{-1}$ for control voltages in a range of and including 2.5 Volts to 15 Volts, and in a range of and including 50-75 cm$^2$V$^{-1}$s$^{-1}$ for control voltages in a range of and including 3 Volts to 15 Volts.

Figure 18:
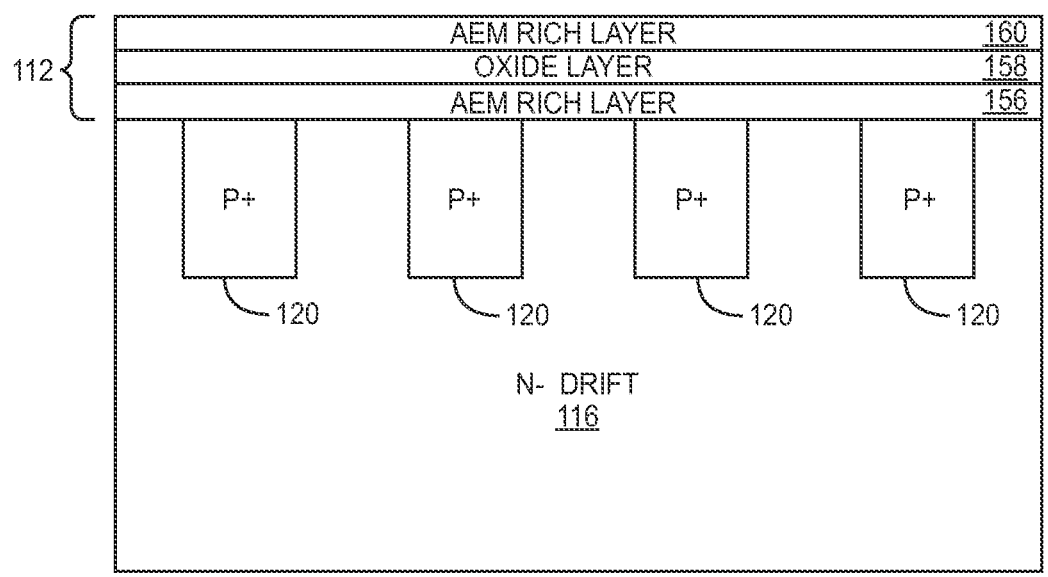
FIG. 18 illustrates a passivation structure for a semiconductor device that includes an alkaline earth metal-oxide-alkaline earth metal structure according to one embodiment of the present disclosure.

FIG. 18 illustrates the passivation structure 112 of FIG. 8 according to yet another embodiment of the present disclosure. In this embodiment, rather than including the interlayer 114 and the dielectric layer 118 (FIG. 8), the passivation structure 112 includes an alkaline earth metal-oxide-alkaline earth metal structure formed by a first AEM rich layer 156 on or directly on the substrate 116, an oxide layer 158 on or directly on the first AEM rich layer 156 opposite the substrate 116, and a second AEM rich layer 160 on a surface of the oxide layer 158 opposite the first AEM rich layer 156. The AEM rich layers 156 and 160 contain the same or different alkaline earth metals, which are preferably Ba or Sr. However, other alkaline earth metals may be used. Each of the AEM rich layers 156 and 160 may be, for example:

- a layer of alkaline earth metal (e.g., a layer of Ba or Sr),
- multiple layers of the same or different alkaline earth metals (e.g., multiple layers of Ba or a layer of Ba followed by a layer of Sr),
- one or more layers of the same or different alkaline earth metals and one or more layers of the same or different oxides on or directly on the one or more layers of alkaline earth metal,
- one or more oxide layers containing an alkaline earth metal (e.g., BaO or Ba$_X$Si$_Y$O$_Z$), or
- one or more oxynitride layers containing an alkaline earth metal (e.g., BaO$_X$N$_Y$).

In one exemplary embodiment, each of the AEM rich layers 156 and 160 is BaO. In another exemplary embodiment, each of the AEM rich layers 156 and 160 is Ba$_X$Si$_Y$O$_Z$. Notably, the first and second AEM rich layers 156 and 160 may be formed using, for example, any of the dry or wet chemistry processes described above with respect to the interlayer 22 that are suitable for forming the AEM rich layers 156 and 160. The passivation structure 112 containing the alkaline earth metal provides a high quality interface, which in turn results in less interfacial charge trapping.

The concepts described herein provide for substantial opportunity for variation without departing from the spirit or scope of the present disclosure. For example, the semiconductor devices specifically illustrated and described herein are exemplary. One of ordinary skill in the art will recognize numerous variations to the illustrated semiconductor devices as well as other types of semiconductor devices to which the disclosed gate, or control contact, stack is applicable. These variations and additional semiconductor devices are considered to be within the scope of the present disclosure. As another example, while the specific devices illustrated herein are n-channel devices, the concepts described herein are equally applicable to p-channel devices. The disclosed gate, or control contact, stack can also be used with similar p-channel devices (e.g., a p-channel MOSFET or a p-channel IGBT). As a final example, while the present disclosure focuses on the use of SiC substrates, other types of substrates may be used.

Those skilled in the art will recognize improvements and modifications to the preferred embodiments of the present disclosure. All such improvements and modifications are considered within the scope of the concepts disclosed herein and the claims that follow.

What is claimed is:

1. A method of enhancing a channel mobility of a semiconductor device comprising:
   providing a silicon carbide substrate comprising a channel region; and
   providing a gate stack on the silicon carbide substrate over the channel region, the gate stack comprising a first alkaline earth metal layer, an amorphous wide bandgap dielectric layer over the first alkaline earth metal layer, and a second alkaline earth metal layer over the amorphous wide bandgap dielectric layer;
   wherein providing the gate stack on the silicon carbide substrate over the channel region comprises providing the first alkaline earth metal layer directly on the silicon carbide substrate over the channel region using wet chemistry such that the first alkaline earth metal layer is between the silicon carbide substrate and the amorphous wide bandgap dielectric layer thereby enhancing the channel mobility of the semiconductor device.

2. The method of claim 1 wherein one of the first alkaline earth metal layer and the second alkaline earth metal layer is Barium (Ba).

3. The method of claim 1 wherein one of the first alkaline earth metal layer and the second alkaline earth metal layer is Strontium (Sr).

4. The method of claim 1 wherein one of the first alkaline earth metal layer and the second alkaline earth metal layer is an oxide containing the alkaline earth metal.

5. The method of claim 4 wherein the oxide containing the alkaline earth metal is Barium Oxide.

6. The method of claim 4 wherein the oxide containing the alkaline earth metal is Ba$_X$Si$_Y$O$_Z$.

7. The method of claim 1 wherein the first alkaline earth metal layer is an oxynitride containing the alkaline earth metal.

8. The method of claim 7 wherein the oxynitride is BaO$_X$N$_Y$.

9. The method of claim 1 wherein the amorphous wide bandgap dielectric layer is formed of one of a group consisting of: Silicon Dioxide (SiO$_2$), Aluminum Oxide (Al$_2$O$_3$), and Hafnium Oxide (HfO).

10. The method of claim 1 wherein at least one of the first alkaline earth metal layer and the second alkaline earth metal layer contains Barium (Ba).

11. The method of claim 1 wherein at least one of the first alkaline earth metal layer and the second alkaline earth metal layer contains Strontium (Sr).

12. The method of claim 1 wherein providing the first alkaline earth metal layer on the surface of the silicon carbide substrate comprises providing the first alkaline earth metal layer directly on the surface of the silicon carbide substrate.

13. The method of claim 1 wherein providing the gate stack on the silicon carbide substrate further comprises providing a gate metal layer on a surface of the second alkaline earth metal layer opposite the amorphous wide bandgap dielectric layer.

14. The method of claim 1 wherein the silicon carbide substrate is one of a group consisting of: a 4H Silicon Carbide (SiC) substrate, a 6H SiC substrate, a 3C SiC substrate, and a 15R SiC substrate.

15. The method of claim 1 wherein the semiconductor device is a lateral Metal-Oxide-Semiconductor Field Effect Transistor (MOSFET), the method further comprising:
  providing a source region formed in the silicon carbide substrate; and
  providing a drain region formed in the silicon carbide substrate;
  wherein providing the gate stack comprises providing the gate stack on the silicon carbide substrate between the source and drain regions.

16. The method of claim 15 wherein the silicon carbide substrate is one of a group consisting of: a 4H Silicon Carbide (SiC) substrate, a 6H SiC substrate, a 3C SiC substrate, and a 15R SiC substrate.

17. The method of fabrication of claim 1 wherein the semiconductor device is a vertical Metal-Oxide-Semiconductor Field Effect Transistor (MOSFET), and the method further comprises:
  providing a well of a first conductivity type formed in the substrate, the substrate being of a second conductivity type;
  providing a source region of the second conductivity type formed in the substrate, wherein the gate stack is on the substrate and extends over at least a portion of the well and the source region; and
  providing a drain contact on a surface of the substrate opposite the gate stack.

18. The method of fabrication of claim 17 wherein the substrate is one of a group consisting of: a 4H Silicon Carbide (SiC) substrate, a 6H SiC substrate, a 3C SiC substrate, and a 15R SiC substrate.

19. The method of fabrication of claim 1 wherein the semiconductor device is an Insulated Gate Bipolar Transistor (IGBT), and the method further comprises:
  providing an emitter region formed in the substrate, wherein the gate stack is on the substrate and extends over at least a portion of the emitter region; and
  providing a collector contact on a surface of the substrate opposite the gate stack.

20. The method of fabrication of claim 19 wherein the substrate is one of a group consisting of: a 4H Silicon Carbide (SiC) substrate, a 6H SiC substrate, a 3C SiC substrate, and a 15R SiC substrate.

21. The method of fabrication of claim 1 wherein the semiconductor device is a trench field effect transistor, and:
  the substrate comprises:
    a first layer of a first conductivity type;
    a drift layer of the first conductivity type on a first surface of the first layer of the first conductivity type;
    a well of a second conductivity type on a surface of the drift layer opposite the first layer;
    a source region of the first conductivity type in or on the well;
    a source contact on a surface of the source region opposite the well;
    a drain contact on a second surface of the first layer opposite the drift layer; and
    a trench that extends from the surface of the source region through the well to the surface of the drift layer, wherein the gate stack is formed in the trench.

22. The method of fabrication of claim 21 wherein the substrate is one of a group consisting of: a 4H Silicon Carbide (SiC) substrate, a 6H SiC substrate, a 3C SiC substrate, and a 15R SiC substrate.

23. The method of claim 1 wherein providing the first alkaline earth metal layer on the silicon carbide substrate over the channel region using wet chemistry comprises:
  dipping the silicon carbide substrate in a fluid containing the alkaline earth metal; and
  drying the silicon carbide substrate such that the layer containing the alkaline earth metal is provided on the silicon carbide substrate.

24. The method of claim 1 wherein providing the first alkaline earth metal layer on the silicon carbide substrate over the channel region using wet chemistry comprises:
  dipping the silicon carbide substrate in a fluid containing the alkaline earth metal;
  drying the silicon carbide substrate such that a residue comprising the alkaline earth metal is provided on the silicon carbide substrate; and
  oxidizing the residue to provide the layer containing the alkaline earth metal.

25. The method of claim 1 wherein providing the first alkaline earth metal layer on the silicon carbide substrate over the channel region using wet chemistry comprises:
  spinning a fluid containing the alkaline earth metal onto the silicon carbide substrate; and
  drying the silicon carbide substrate such that the layer containing the alkaline earth metal is provided on the silicon carbide substrate.

26. The method of claim 1 wherein providing the first alkaline earth metal layer on the silicon carbide substrate over the channel region using wet chemistry comprises:
  spinning a fluid containing the alkaline earth metal onto the silicon carbide substrate;
  drying the silicon carbide substrate such that a residue containing the alkaline earth metal is provided on the silicon carbide substrate; and
  oxidizing the residue to provide the layer containing the alkaline earth metal.

27. The method of claim 1 wherein providing the first alkaline earth metal layer on the silicon carbide substrate over the channel region using wet chemistry comprises:
  immersing the silicon carbide substrate into a pool containing a fluid containing the alkaline earth metal; and
  draining the pool in an oxygen-rich environment such that the layer containing the alkaline earth metal is provided on the silicon carbide substrate.

28. The method of claim 1 wherein providing the first alkaline earth metal layer on the silicon carbide substrate over the channel region using wet chemistry comprises bubbling a fluid containing the alkaline earth metal through an oxide on a surface of the silicon carbide substrate.

29. The method of claim 1 wherein providing the first alkaline earth metal layer on the silicon carbide substrate over the channel region using wet chemistry comprises vapor phase deposition of a fluid containing the alkaline earth metal onto a surface of the silicon carbide substrate in a temperature controlled environment.

30. The method of claim 1 wherein providing the first alkaline earth metal layer on the silicon carbide substrate over the channel region using wet chemistry comprises spraying a fluid containing the alkaline earth metal onto the surface of the silicon carbide substrate.

* * * * *